(12) United States Patent
Carmichael et al.

(10) Patent No.: US 10,495,689 B2
(45) Date of Patent: *Dec. 3, 2019

(54) BLADE CENTRIC AUTOMATIC TEST EQUIPMENT SYSTEM

(71) Applicants: Richard Carmichael, San Jose, CA (US); Edward Peek, Monument, CO (US); James St. Jean, Meredith, NH (US); David Reynolds, Gilford, NH (US); Michael Ferland, Tualatin, OR (US)

(72) Inventors: Richard Carmichael, San Jose, CA (US); Edward Peek, Monument, CO (US); James St. Jean, Meredith, NH (US); David Reynolds, Gilford, NH (US); Michael Ferland, Tualatin, OR (US)

(73) Assignee: Golden Oak Systems, Inc., San Jose, CA (US)

( * ) Notice: Subject to any disclaimer, the term of this patent is extended or adjusted under 35 U.S.C. 154(b) by 120 days.

This patent is subject to a terminal disclaimer.

(21) Appl. No.: 15/880,547

(22) Filed: Jan. 26, 2018

(65) Prior Publication Data

US 2018/0189159 A1 Jul. 5, 2018

Related U.S. Application Data

(63) Continuation of application No. 14/940,338, filed on Nov. 13, 2015, now Pat. No. 9,921,931.

(60) Provisional application No. 62/092,643, filed on Dec. 16, 2014.

(51) Int. Cl.
| | | |
|---|---|---|
| G06F 11/27 | (2006.01) | |
| G01R 31/3183 | (2006.01) | |
| G06F 11/273 | (2006.01) | |
| G06F 13/16 | (2006.01) | |
| G06F 13/42 | (2006.01) | |
| G06F 13/36 | (2006.01) | |
| G06F 13/40 | (2006.01) | |

(Continued)

(52) U.S. Cl.
CPC .... *G01R 31/318307* (2013.01); *G06F 11/261* (2013.01); *G06F 11/2635* (2013.01); *G06F 11/2733* (2013.01); *G06F 13/1689* (2013.01); *G06F 13/36* (2013.01); *G06F 13/4068* (2013.01); *G06F 13/4072* (2013.01); *G06F 13/4282* (2013.01)

(58) Field of Classification Search
None
See application file for complete search history.

(56) References Cited

U.S. PATENT DOCUMENTS 4,835,728 A * 5/1989 Si .............................. G06F 1/04
327/141
9,665,525 B2 * 5/2017 Soffer ................. G06F 13/4221
(Continued)

*Primary Examiner* — Yolanda L Wilson
(74) *Attorney, Agent, or Firm* — Tran & Associates

(57) ABSTRACT

An automated test equipment (ATE) system includes a plurality of test blades each coupled to a test blade connector and mounted on a circular track; a central reference clock (CRC) having an origin point at a center of the circle; and a clock/sync connector coupled to the CRC through a zero skew clock connection to one or more sync buses, wherein each instrument utilizes the CRC to coordinate its testing process with another instrument.

20 Claims, 36 Drawing Sheets

(51) Int. Cl.
*G06F 11/26* (2006.01)
*G06F 11/263* (2006.01)

(56) References Cited

U.S. PATENT DOCUMENTS

| | | | |
|---|---|---|---|
| 2003/0005250 A1* | 1/2003 | Johnson | G06F 13/1689 711/167 |
| 2003/0214981 A1* | 11/2003 | Kocalar | G06F 11/2733 370/537 |
| 2009/0113245 A1* | 4/2009 | Conner | G06F 11/2733 714/33 |
| 2009/0192752 A1* | 7/2009 | Powers | G06F 11/2733 702/117 |
| 2009/0235120 A1* | 9/2009 | Gettemy | G06F 11/2733 714/30 |
| 2010/0235693 A1* | 9/2010 | Kang | G06F 11/2733 714/718 |
| 2011/0040922 A1* | 2/2011 | Dearman | G06F 11/2733 710/316 |
| 2013/0054170 A1* | 2/2013 | Sobajic | G06F 11/2294 702/82 |
| 2014/0253146 A1* | 9/2014 | Kesler | G01R 1/206 324/555 |
| 2015/0058671 A1* | 2/2015 | Tahara | G01R 31/31907 714/32 |

\* cited by examiner

Instrument Board Clocking #2

FPGA Clock Circuits

Note:

1. 16 Bit Counter has 2 functions.
    a. To start Instrument in known programmable phase.
    b. To delay the start of the Instrument.
2. Sync starts Instrument +-1 Instrument MC.
3. Instrument Clock Vector Rate of 1830Hz to 50MHz for n -16

Synchronization Control

Type 1 – Modulo 3

Note:

1. Type 1 spans ONLY 3 Boards in Cobra 24 (2 Boards in Mini)
2. Reference Clock, Master Clock, Sync Clock
3. Equal path delay on Clock Board and Backplane.
4. Unidirectional.
5. Differential.
6. The most accurate synchronization.
7. Examples – System Clock Distribution.

Synchronization Control

Type 1a – Modulo 6

Note:
1. Type 1a spans 6 Boards in Cobra 24 (5 Boards in Mini)
2. I/O Update, Clock Start
3. Unequal path delay on Backplane (16nS window).
4. Unidirectional.
5. Differential.
6. Captured on Instrument with 62.5MHz Clock

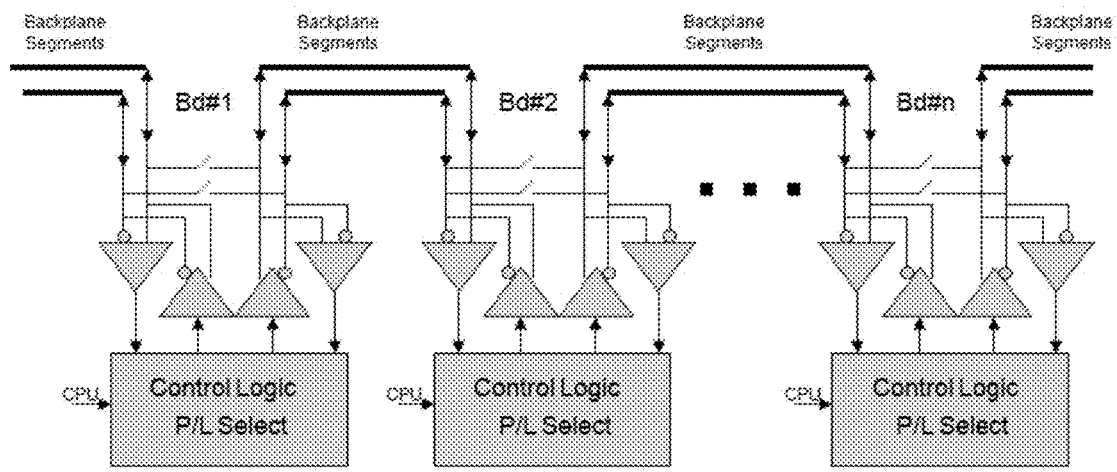

Synchronization Control

Type 2 – Segmented Single Source

Notes:

1. Type 2 spans "n" Consecutive Boards (selectable).
2. Propagation Delays add across backplane (length and time changes with number of boards).
3. Selectable pipelines on inputs (may be fixed).
4. Bi-directional.
5. Source – Destination selectable (Single Source).
6. Differential.
7. Vector Rate/Instrument Clock accuracy.
8. Example – Digital to Mixed Signal Instrument.

FIG. 5H

Synchronization Control

Type 3 – Segmented-Multi Source

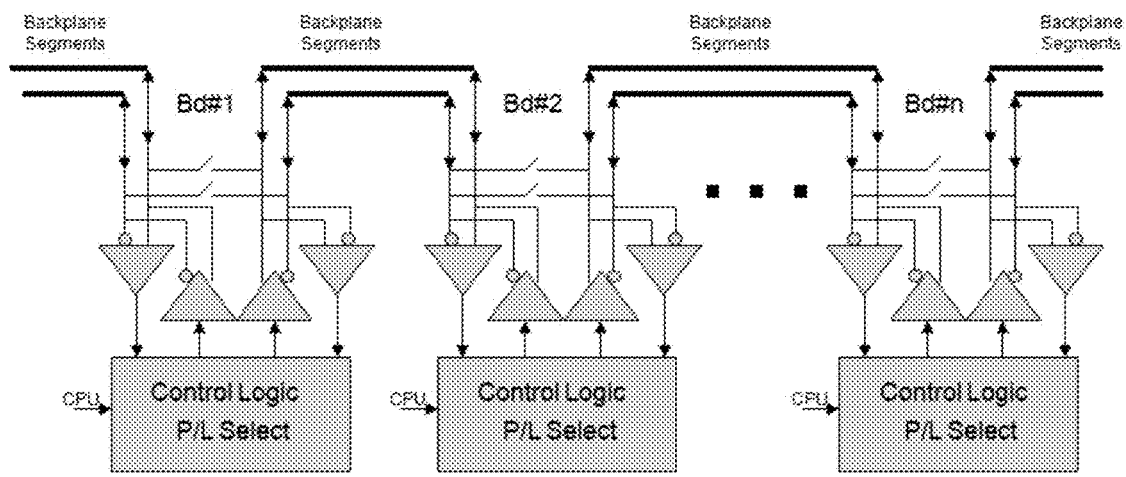

Notes:

1. Type 3 spans "n" Consecutive Boards
2. Propagation Delays add across backplane (length and time changes with number of boards).
3. Selectable pipelines on inputs (may be fixed).
4. Bi-directional.
5. Source – Destination or both selectable (Multiple Source).
6. Differential Wire-OR.
7. Vector Rate/Instrument Clock accuracy.
8. Example – Error Signal.

FIG. 51

Notes:

1. GP = General Purpose
2. Type 4 spans All Boards or Backplane Section
3. Propagation Delays are not de-skewed
4. Modulo 6 Backplane segment jumpers possible.
5. Source – Destination selectable (Single Source and Multiple Destination).
6. Bi-directional.
7. Differential.
8. The least accurate synchronization.
9. Example – Slow Analog Instrument Synchronization.

Basic volatile register write

Basic volatile register read

Basic nonvolatile register write

Basic nonvolatile register read

Indirect register write operation

Selectable register write operation

BLADE CENTRIC AUTOMATIC TEST EQUIPMENT SYSTEM

This application claims priority to Provisional Application 62/092,643 filed Dec. 16, 2014, the content of which is incorporated by reference.

BACKGROUND

The present invention relates to ATE systems and methods.

FIG. 1 is a block diagram illustrating a system for explaining a test method of integrated circuit or chip equipment in a conventional art. As described in U.S. Pat. No. 6,883,128, conventional test equipment includes a PC equipment 201 having a chip equipment 210, a logic analyzer 202 for trigging and obtaining a signal waveform of a terminal (pin) group of the chip equipment 210 as a certain fail information, a pattern generation equipment 203 for inputting a signal waveform data(trace data) obtained from the logic analyzer 202 and converting to a test pattern of a desired test equipment and outputting the same, an automatic test equipment(ATE) 204 for testing a chip equipment as a tested device(DUT) 204-1 using a test pattern from the pattern generation equipment 203 and judging whether an error occurs in the PC equipment, and a mass production ATE 205 for testing the products same as the chip equipment 210 mounted in the PC equipment 201 as a tested device (DUT) 205-1. A test pattern is generated based on a trace data of an operation state of a chip equipment mounted in a PC equipment for thereby testing a tested device. D data extracted from a logic analyzer is capable of only a small amount of a timing pattern which occurs in the PC. Even when a desired amount of the timing pattern is extracted, since the environments between the PC and the ATE are very different, a desired reproduction is not obtained. In addition, the system is expensive. The '128 patent solves this issue by implementing a memory pattern test using a pattern generation substrate in which a processor is designed in an EPLD for implementing a PC test and pattern programming, so that a test evaluated under a PC environment formed of a CPU and chip sets. The PC test and automatic test are separated using a high speed switching device which is capable of implementing a conversion without a signal distortion between the signal lines extended from the chip sets and the pattern generation substrate.

To certify the performance and functionality of modern semiconductor devices, reliable Automatic Test Equipment is required to maximize its utilization. The circuitry of the DUT simulating and monitoring elements all are powered by Direct Current (DC) supplies. Historically, these DC supplies have been generated with a multitude of different individual bulk supplies with different voltage outputs to handle the requirements of the different test elements. These many varied bulk supplies are a major component to Automatic Test Equipment (ATE) failures.

SUMMARY

In one aspect, an automated test equipment (ATE) system includes a plurality of test blades each coupled to a test blade connector and mounted on a circular track; a central reference clock (CRC) having an origin point at a center of the circle; and a clock/sync connector coupled to the CRC through a zero skew clock connection to one or more sync buses, wherein each instrument utilizes the CRC to coordinate its testing process with another instrument.

In another aspect, an ATE system includes a central power supply positioned at a center of a circular track; a plurality of test blades each coupled to a test blade connector and mounted on a circular track; and one or more power converters mounted on a test blade to general power on the test blade.

In a further aspect, an ATE system includes one or more blades as a test head, a server coupled to a suite of Blades, and "Natural Feel" Software to tie the hardware together.

Advantages of the present system may include one or more of the following. The system enhances test performance and decrease the test time and error ratio and cost of the products. In contrast to the "rack-n-stack" instruments available for the engineering bench or after thought add-ons to an existing test system, the Cobra's blades are carefully architected to assure precise synchronization, short test times and production worthy stability. Rather than accept general-purpose solutions trying to solve a wide set of generic needs, Cobra blades focus on the key issues that minimize the real cost of each test challenge. This maximizes the utilization of the purchased capital, directly lowering the Cost Of Test for the user.

The system's centralized power distribution system assures that all instruments have the precise set of voltages and currents desired, in a low-noise environment. This arrangement provides a simplified power distribution to provide a more reliable ATE system by limiting the diversity of bulk power supplies to one voltage. The custom tailored power requirements for now and the future based upon a single voltage reference provided to all major components of Automatic Test Equipment. Power distribution of a single voltage reference has been historically impractical to implement given the circuit demands of Automatic Test Equipment, but this is made possible using the centralized power distribution of the present system.

Another advantage of the system is offered through the "Central Reference Clock" sub-system. A stable, precision oscillator provides the "heartbeat" for test functions and is broadcasted to all instruments. This reference clock is physically connected at the center of the Cobra Motherboard—an origin point that facilitates a clock distribution that approaches "Zero Clock Skew".

BRIEF DESCRIPTION OF THE DRAWINGS

FIGS. 3C-3K show an exemplary hierarchical interface architecture for mapping test addresses.

FIG. 4A shows a central power distribution system while

FIG. 5A-5K show one embodiment of a central clock distribution system.

FIGS. 6A-6I show software programming constructs for the tester.

DESCRIPTION

In the following description, details of various implementations are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 2A:
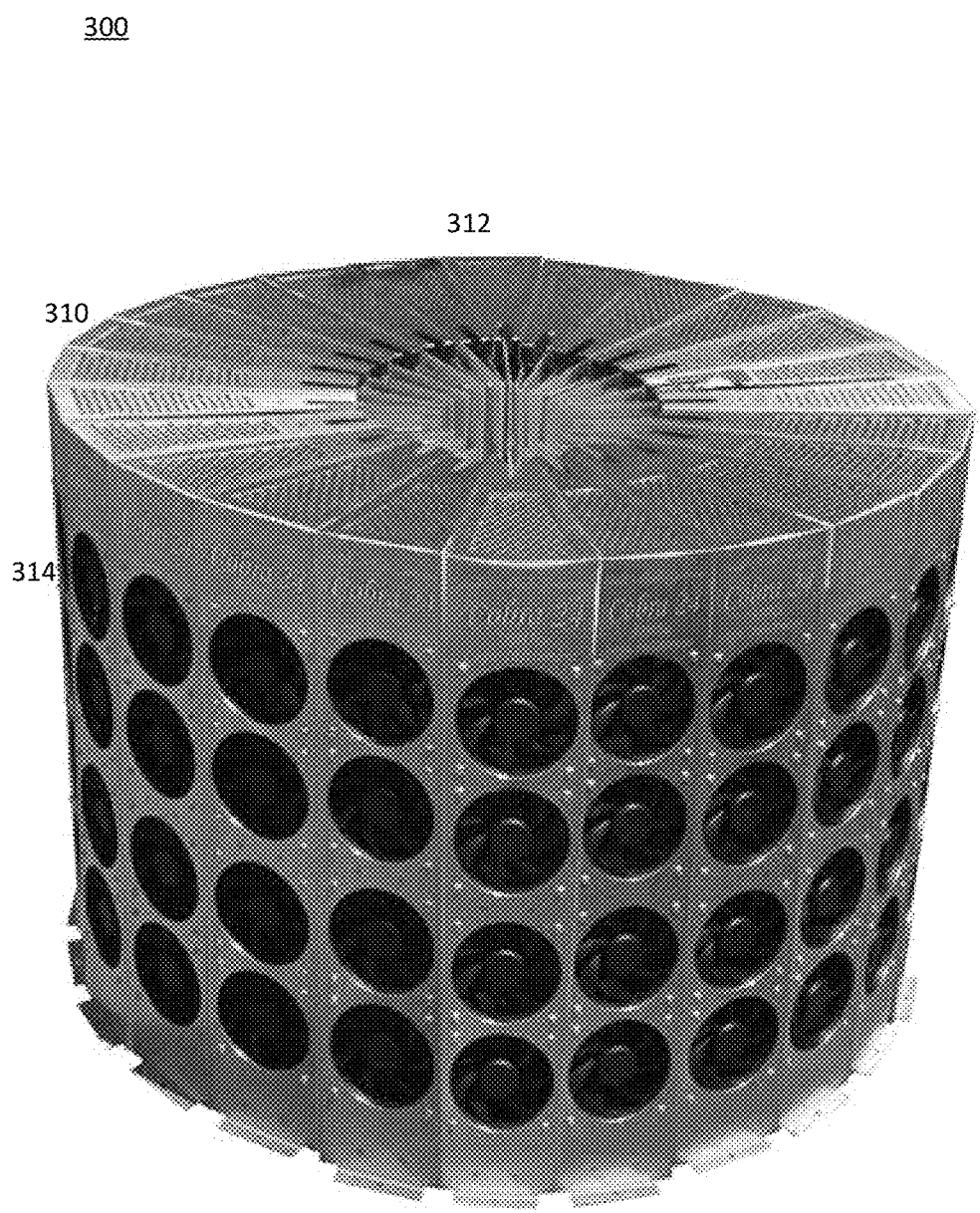
FIG. 2A shows an exemplary tester system.

FIG. 2A shows an exemplary tester system called Cobra. The system has a cylindrical housing 300 that receives a plurality of tester boards with inner edge 312 and outer edge 310. The system also has a plurality of fans to cool the tester boards. One embodiment of Cobra is an advanced system for the automatic testing of semiconductor integrated circuits (IC). It is designed to be quick, quiet, and clean; providing customers with a repeatable, high-throughput, low-cost production test solution. Cobra utilizes the peak of technology to deliver dependable and efficient performance in a small, rugged package. The Cobra offers a "blade" approach to the problem of IC testing. Digital pins, precision DC sources, GHz amplifiers, time analyzers, among others, are all available as test instrument blades (TIB). Customers can select the set of TIBs to best satisfy their testing needs. This Application Specific approach allows one tester platform to provide focused solutions for such varied test problems as NAND FLASH memories and multi-gigabit serial communications chips.

Figure 2B:
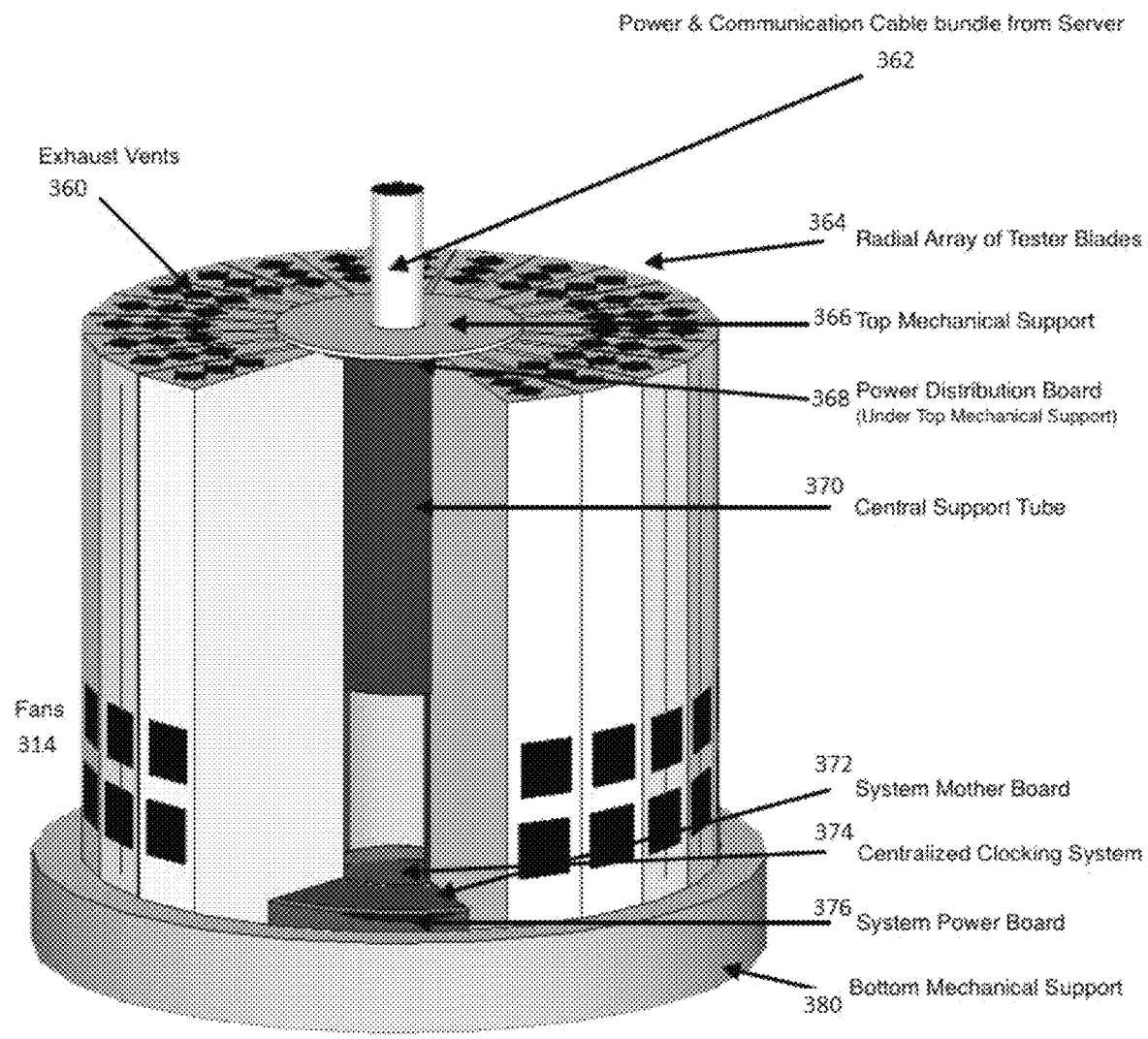
FIG. 2B shows an exemplary tester with a four-blade cut away.

FIG. 2B shows an exemplary tester with a four-blade cut away. Fans 314 are positioned on the outer edges of the system, in addition to exhaust vents 360 on top of the blades. The blades are concentrically arranged as a radial array 364 and rest on a bottom mechanical support 380. At the center of the blades is a power and communication cable bundle 362 and supported by a top mechanical support 366. A power distribution board 368 is positioned on a central support tube 370, and the board 368 is electrically connected to a system motherboard 372. A centralized clocking system 374 is also connected to the motherboard 372, as detailed below.

In one embodiment, the Cobra Test-head has 24 "slots" where tester's blades can be inserted into to add functionality to the Test-head. The Test-head supports a multitude of configurations with presently up to 1920 digital channels in a 900 mm×550 mm cylindrical package. The cylindrical nature of the system benefits the user by providing the shortest possible path between tester functions and the device under test (DUT). Each blade is contained in it own metal chassis with local cooling, mechanical support systems, and shields the electronics from EMF noise. Each Cobra test system will include a TIB chassis in all slots. Slots without active blades will hold "Dummy" blade chassis that maintain balance in the system. The system operates with any number of active blades from 1 to 24. The chassis protects the blade during shipping and handling, also makes a very user-friendly replaceable module. Each of the blades contained in the test head is electrically isolated from the other instruments or any other source. This "Floating" power system assures that each instrument is in the best possible "electrical noise environment" supporting high fidelity, high stability operation of all tester functions. Combined with the shielding provided by the instrument chassis, Cobra is one of the quietest test systems ever constructed. To support the high-density packaging embodied in the Test-head, the cooling system utilizes a computer controlled set of redundant, magnetically floating fans. Changes in room temperature or power duty cycles are managed by altering fan speeds and turning on heaters near critical instrument circuits—assuring stable temperatures and predictable instrument performance. The cooling controllers also monitor the 48 volt system supply to assure overall proper system performance. Should the temperature or the system supply be found faulty, the controller signals an "Alarm" and causes a system shut down. The controller also has a "Red or Green" indicator light which signals when the instruments are operating correctly or when there is a problem and the blade module needs replacement.

Figure 1:
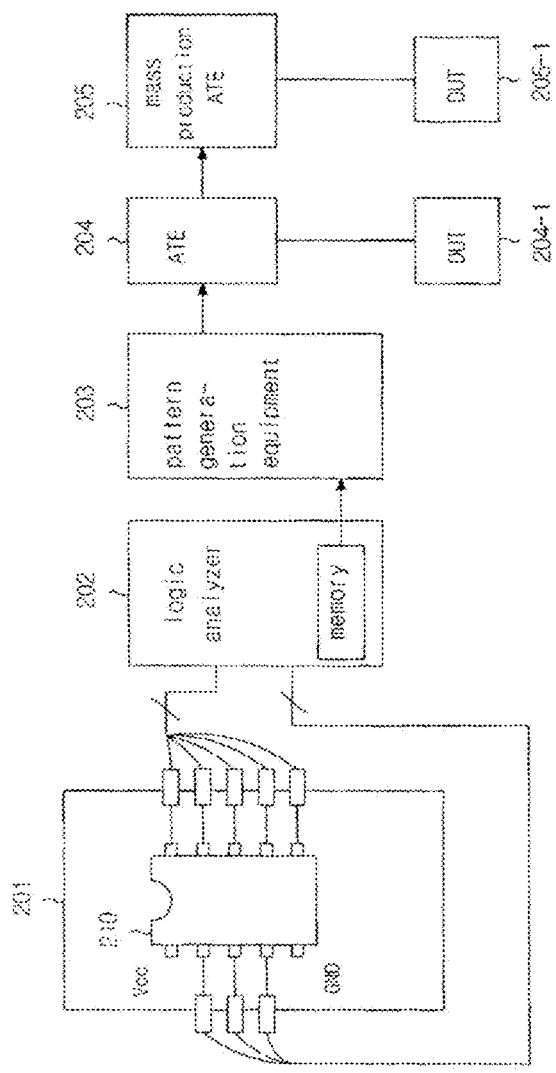
FIG. 1 shows a conventional tester system.
Figure 2C:
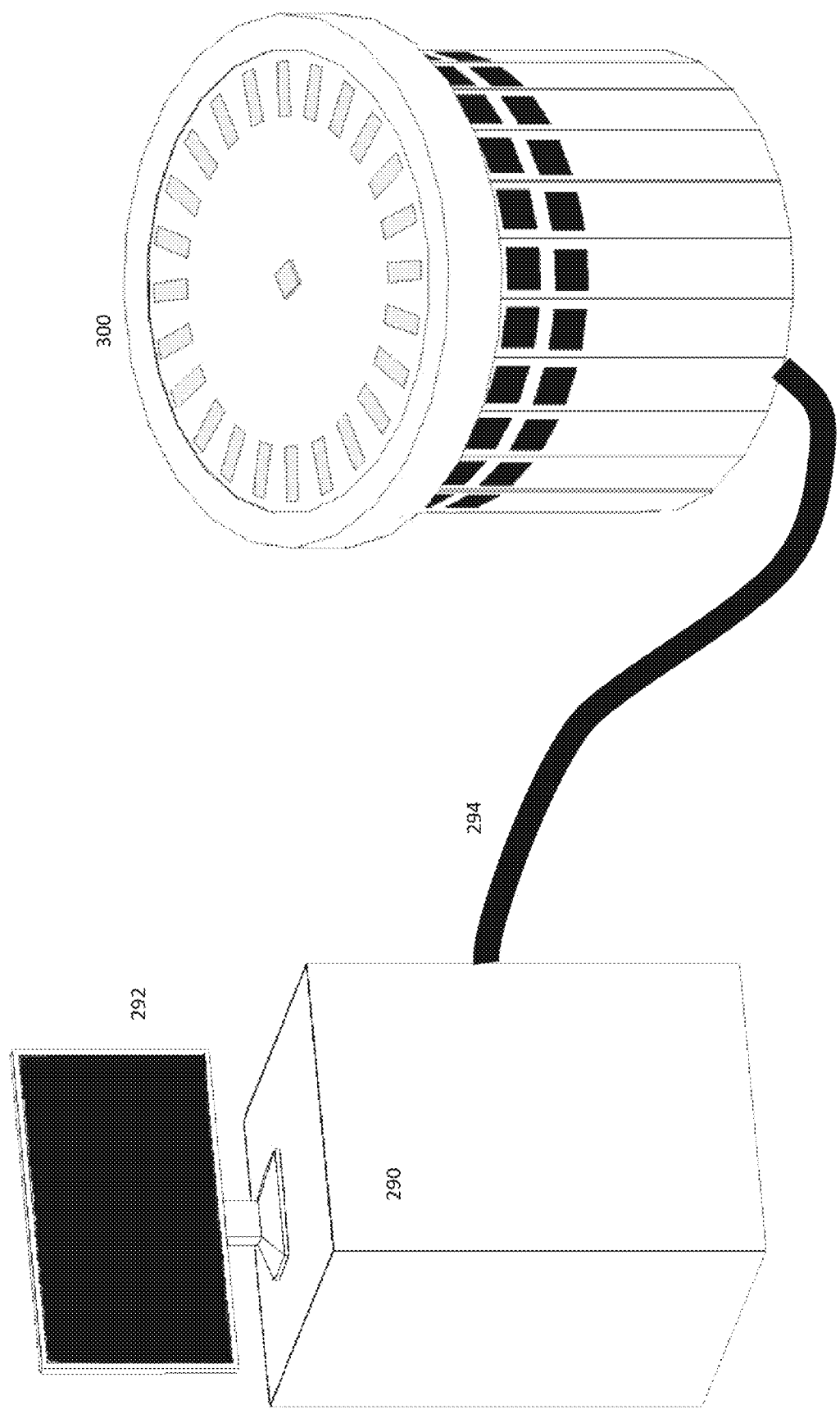
FIG. 2C shows the tester of FIG. 1 with a control computer.

FIG. 2C shows the tester of FIG. 1 with a control computer 290 with a display 292. The computer 290 executes test software as described in more details below, and instructions as well as results are passed back and forth with the tester 300 through a cable bundle 294. In one embodiment, the cable bundle 294 is a PCI Express bus bundle that is shielded. PCI Express (Peripheral Component Interconnect Express), officially abbreviated as PCIe, is a high-speed serial computer expansion bus standard designed to replace the older PCI, PCI-X, and AGP bus standards. PCIe has numerous improvements over the older bus standards, including higher maximum system bus throughput, lower I/O pin count and smaller physical footprint, better performance-scaling for bus devices, a more detailed error detection and reporting mechanism (Advanced Error Reporting (AER)[1]), and native hot-plug functionality. More recent revisions of the PCIe standard support hardware I/O virtualization. PCIe is based on point-to-point topology, with separate serial links connecting every device to the root complex (host). Due to its shared bus topology, access to the older PCI bus is arbitrated (in the case of multiple masters), and limited to one master at a time, in a single direction. Furthermore, the older PCI clocking scheme limits the bus clock to the slowest peripheral on the bus (regardless of the devices involved in the bus transaction). In contrast, a PCIe bus link supports full-duplex communication between any two endpoints, with no inherent limitation on concurrent access across multiple endpoints. In terms of bus protocol, PCIe communication is encapsulated in packets. The work of packetizing and de-packetizing data and status-message traffic is handled by the transaction layer of the PCIe port (described later). Radical differences in electrical signaling and bus protocol require the use of a different mechanical form factor and expansion connectors (and thus, new motherboards and new adapter boards); PCI slots and PCIe slots are not interchangeable. At the software level, PCIe preserves backward compatibility with PCI; legacy PCI system software can detect and configure newer PCIe devices without explicit support for the PCIe standard, though PCIe's new features are inaccessible. The PCIe link between two devices can consist of anywhere from 1 to 32 lanes. In a multi-lane link, the packet data is striped across lanes, and peak data-throughput scales with the overall link width. The lane count is automatically negotiated during device initialization, and can be restricted by either endpoint. For example, a single-lane PCIe (×1) card can be inserted into a multi-lane slot (×4, ×8, etc.), and the initialization cycle auto-negotiates the highest mutually supported lane count. The link can dynamically down-configure the link to use fewer lanes, thus providing some measure of failure tolerance in the presence of bad or unreliable lanes. The PCIe standard defines slots and connectors for multiple widths: ×1, ×4, ×8, ×16, ×32. As a point of reference, a PCI-X (133 MHz 64-bit) device and PCIe device using four lanes (×4), Gen1 speed have roughly the same peak transfer rate in a single-direction: 1064 MB/sec. The PCIe bus has the potential to perform better than the PCI-X bus in cases where multiple devices are transferring data communicating simultaneously, or if communication with the PCIe peripheral is bidirectional. More details on the PCIe interface with the computer of FIG. 2C is detailed below.

Figure 2D:
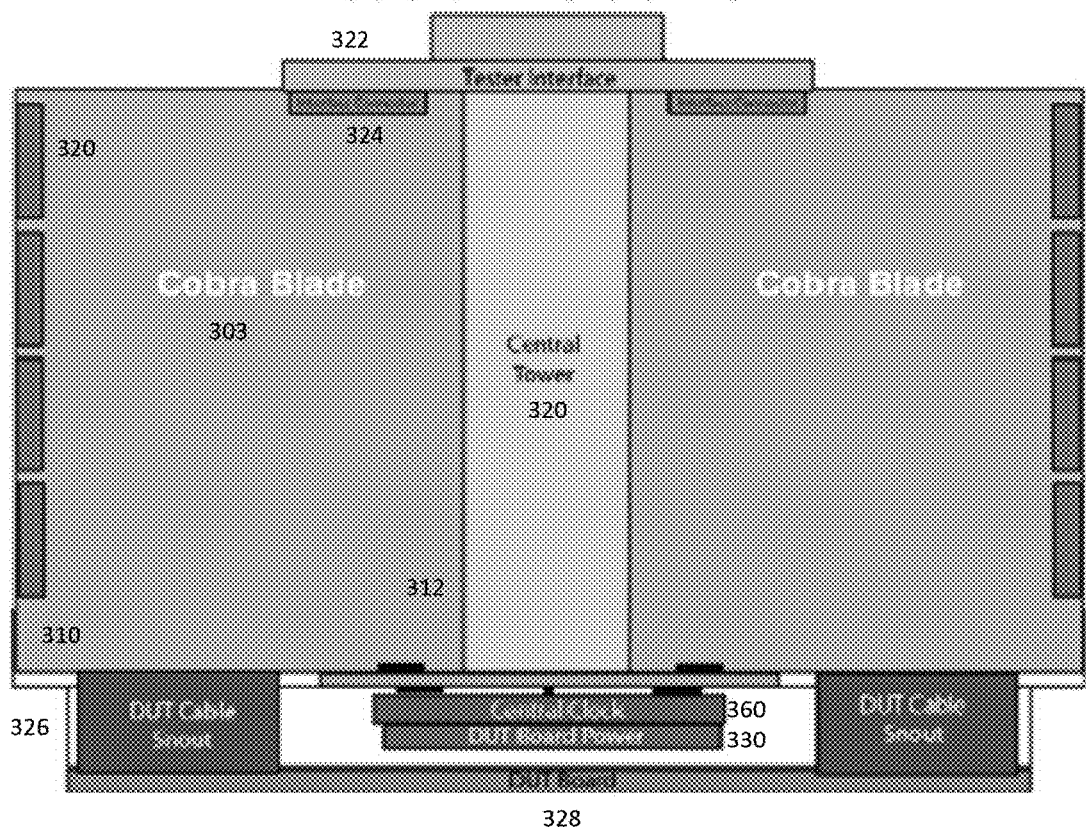
FIG. 2D shows an exemplary cross-sectional side view of the system.

FIG. 2D shows an exemplary side view of the system 300 where a central tower 320 is formed with the inner edges 312 of a plurality of concentrically positioned tester blades 303. The system has a plurality of test blades 303, each with plurality of connectors 320 that are positioned near the outer edge 310 that allows the blades 303 to intercommunicate. In addition, a tester interface 322 communicates with each blade through a top connector 324. The device under test (DUT) is positioned on a DUT board 328 that communicates with the tester blades 303 through a DUT cable snout 326. A DUT power system 330 and a central clock distribution system 360 are positioned under the central tower 320 and in electrical communication with the blades 303. The Cobra test head can be thought of as a nest for 1 to 24 test instrument blades.

One implementation of the Cobra instruments contains various standard features in addition to the circuits required to provide their specific functions, among others:

DC-to-DC conversion to create all the required voltages from the 48V bulk supply
Local control processor with memory
Synchronization Controller for Inter-Instrument Communication
DC Isolated PCi Express for communications with a controller
Standard "Nest" connector for connection to:
Isolated Buss
48V bulk supply
Master Clock
16-bit wide sync bus
Relay isolated connection to Mother for validation
Selected connector to test fixture (load board).

Figure 4A:
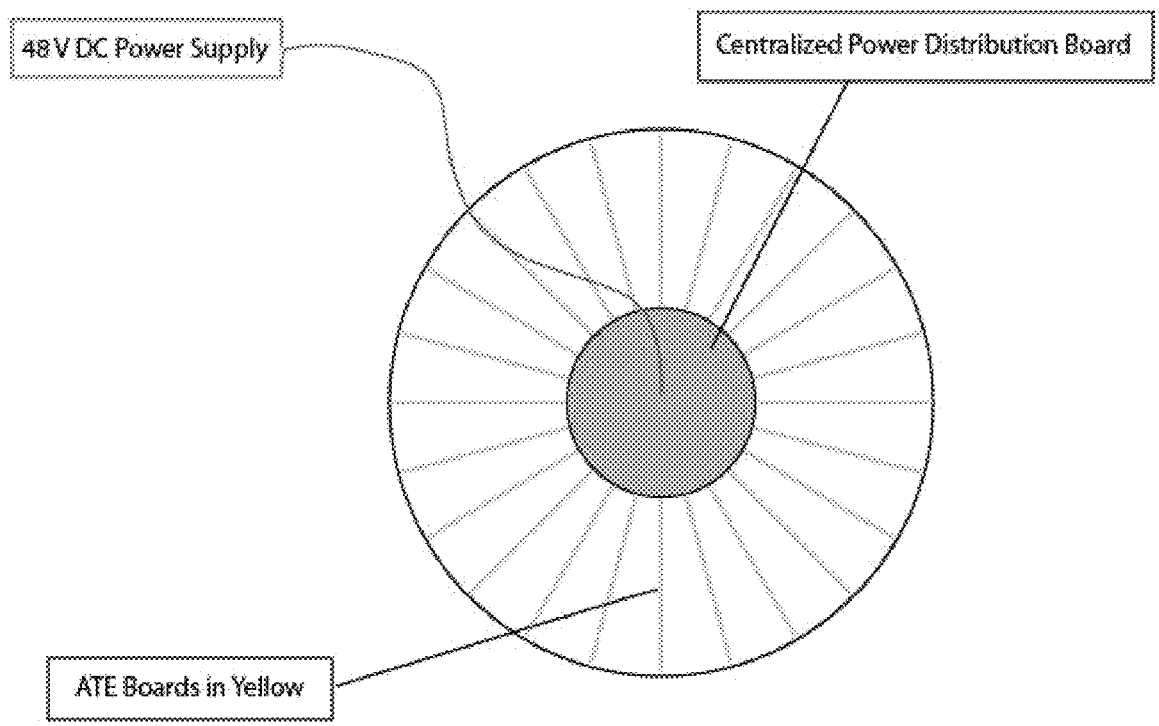
Figure 4B:
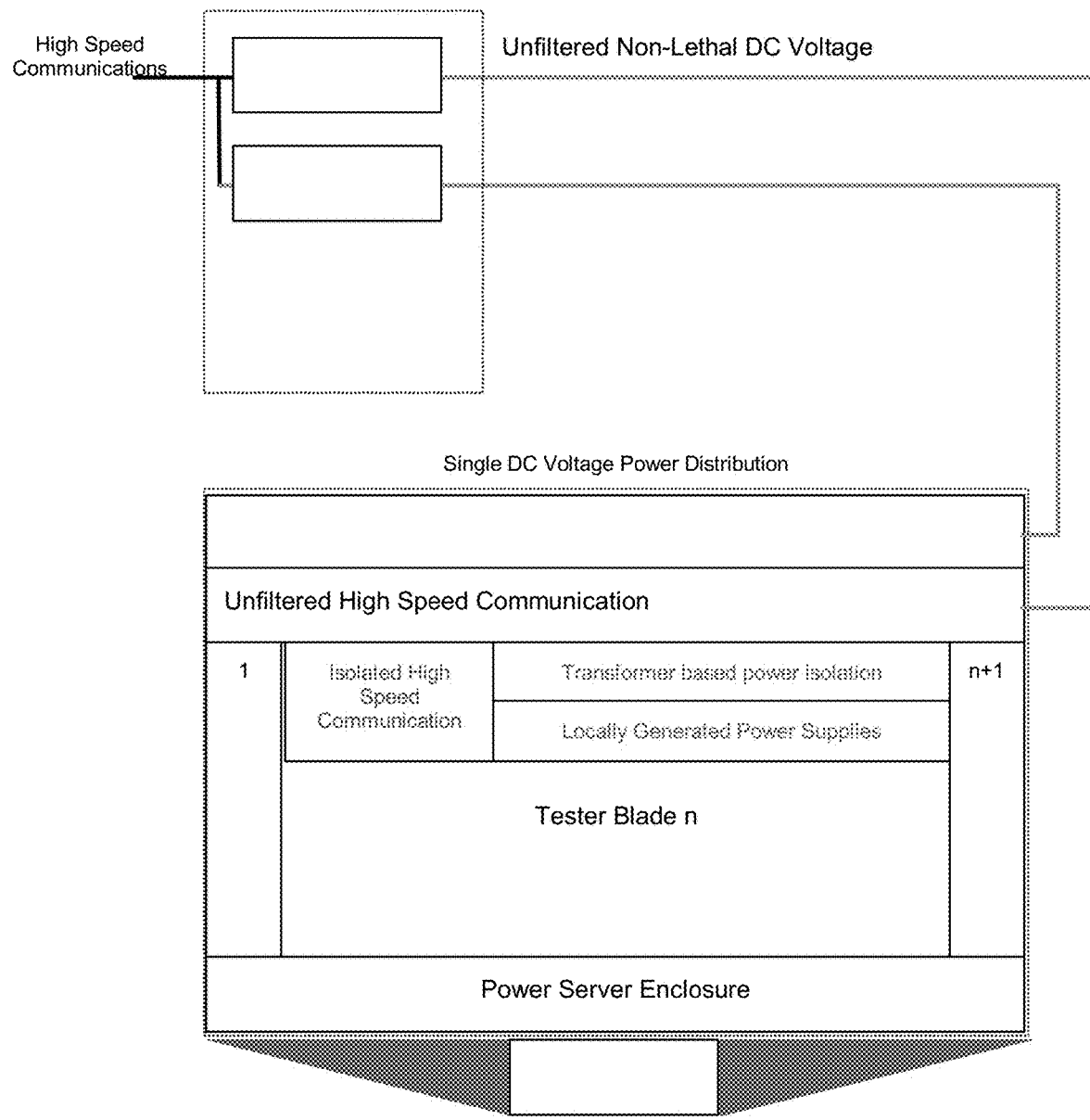
FIG. 4B shows an exemplary electrical distribution scheme for the system of FIG. 4A

The Testhead provides the TIBs: mechanical support, power distribution, cooling, high-speed communications, advanced clocking and coherent synchronization. It is designed to provide a benevolent, supportive environment for optimized performance. A stable, low-noise electronic environment is necessary to fully assure the quality of microelectronic circuits during the test process, this is the core of The Cobra Test System. From its computer controlled cooling, to its ultra-low-noise power distribution process and isolated communications bus, Cobra is the rock-solid reference point demanded by integrated circuit engineering and manufacturing. FIGS. 4A and 4B detail the power distribution that provides the stable low noise power supply to the tester blades 303.

Figure 3A:
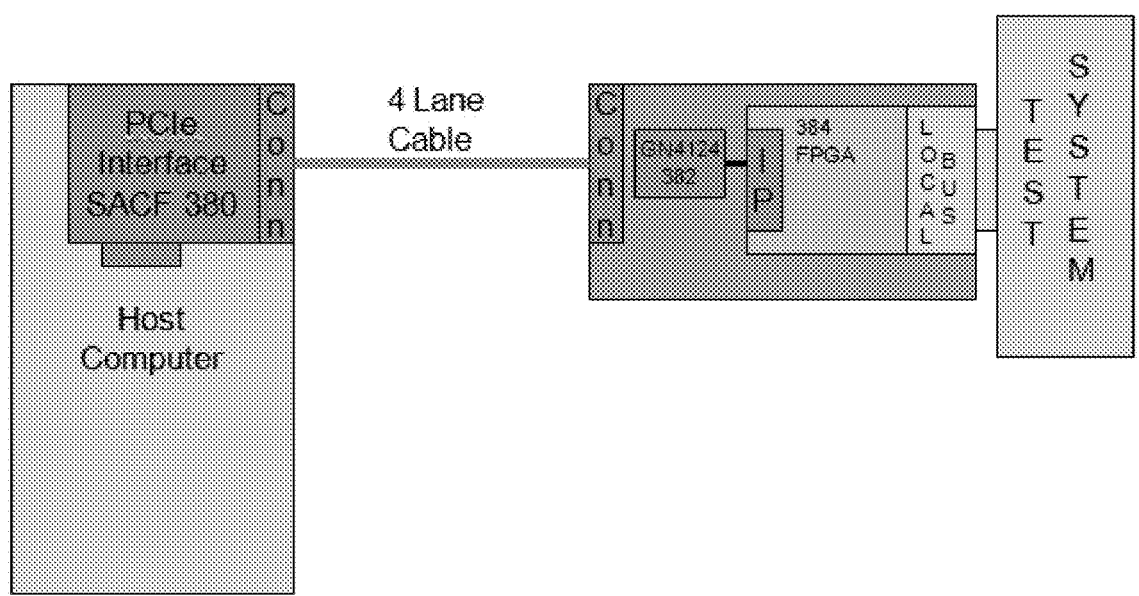
FIG. 3A shows an exemplary PCIe cable interface.

FIG. 3A shows an exemplary PCIe cable interface. FIG. 3 shows the relationship between the Host Computer 290 and the Test System 300. The system uses an adaptive semaphore signal to throttle the data transmission between the Host computer and the Test System. Since several serial interface protocols are used within each Blade, it is better not to run the communication at the slowest rate to accommodate the slowest device. This issue is avoided by using a "Self Addressing Circular Fifo" (SACF) 380 to receive data from the Host Computer. The SACF 380 is located on the Host Interface Board. Since the Host can send data faster than can be distributed through serial protocols, the system needs to throttle the data transfer. The SACF 380 stores several data transactions before the system can slow down the transfers. After the system can process the data and empty the Fifo, the system can request more data transfers. The time for these interactive transfers is dependent on the Blade requirements. For fast transactions data can be sent at 32 bits in about 200 nS in one implementation, but for long serial transactions the time becomes greater than 4 uS. Any required speed can be accommodated using this technique. Using this method the system can always transfer data at the maximum speed allowed by the hardware on each Blade.

Figure 3B:
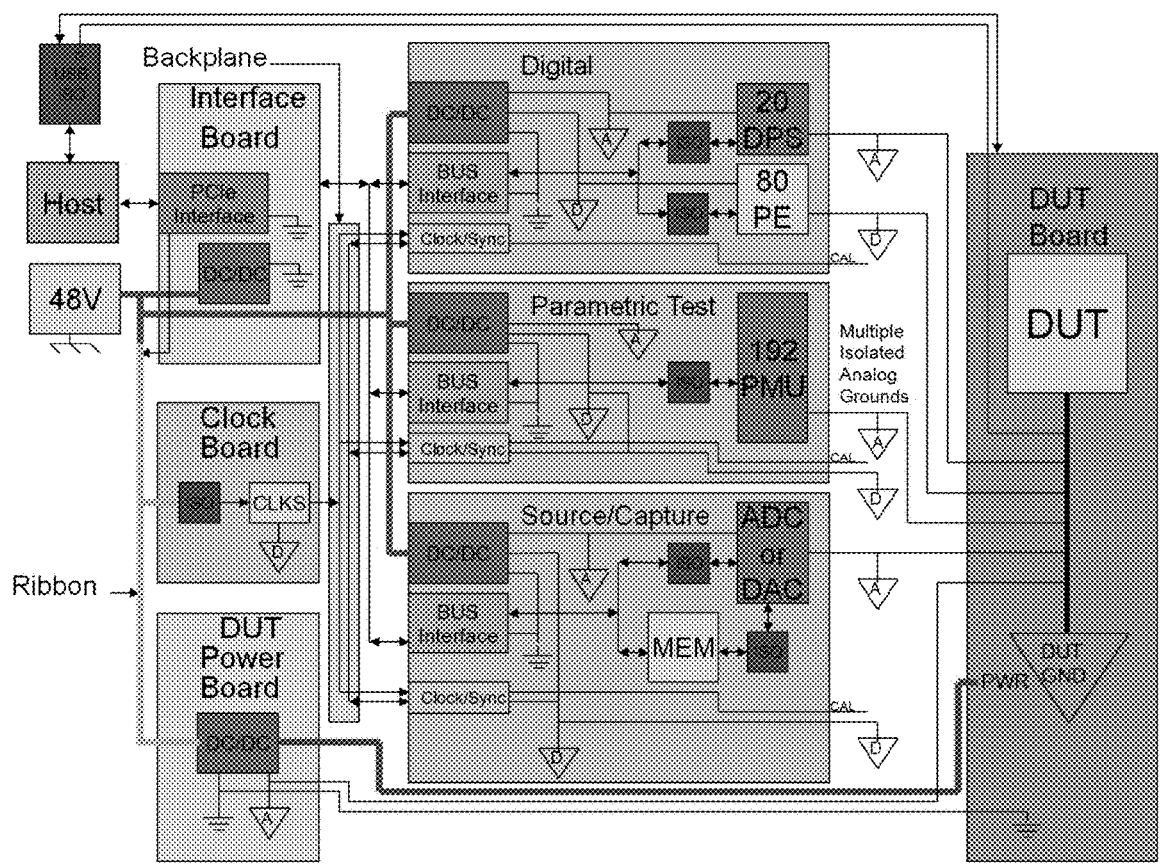
FIG. 3B shows an exemplary arrangement for minimizing noise for multiple blade instruments.
Figure 3C:
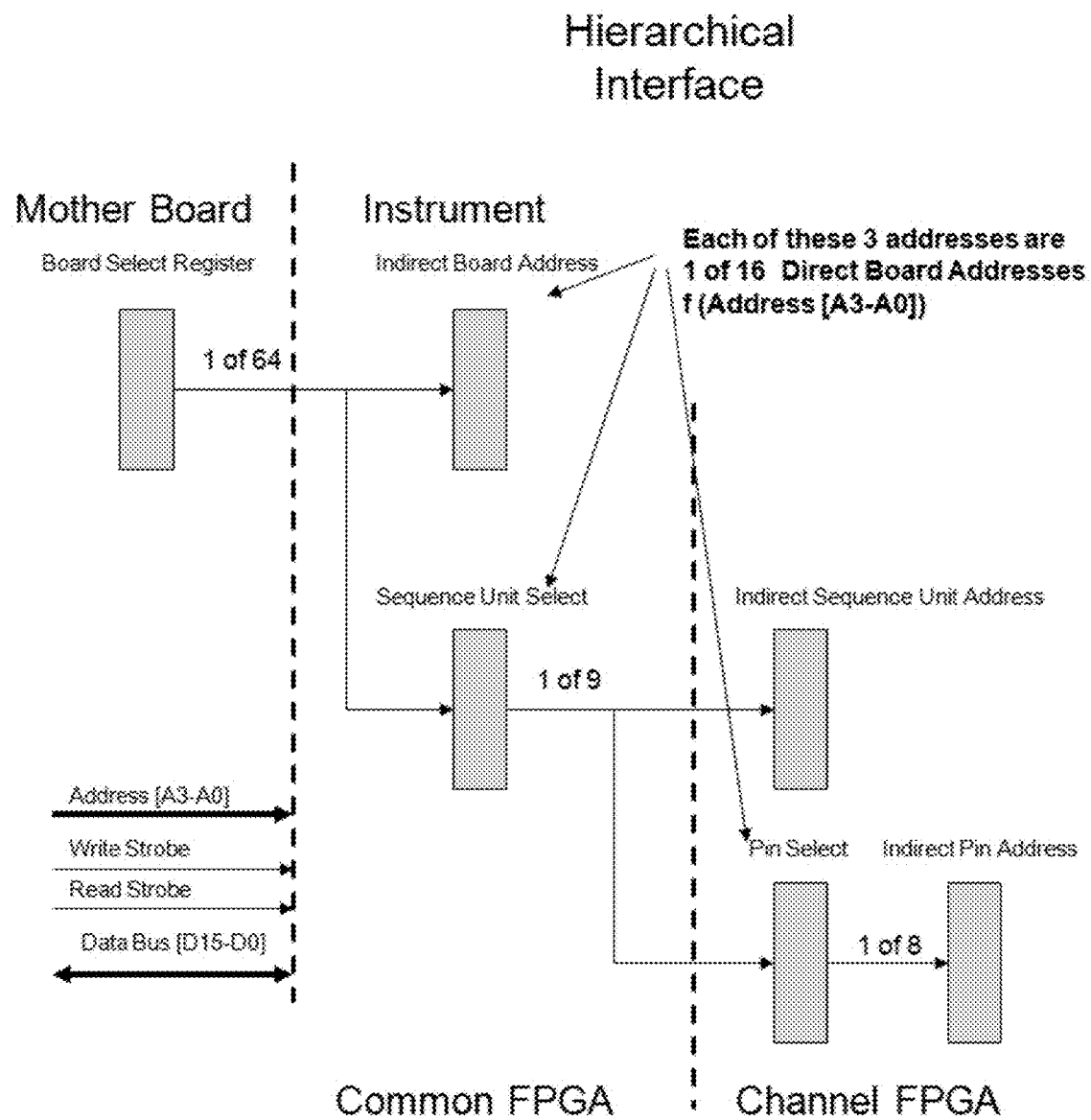
Figure 3D:
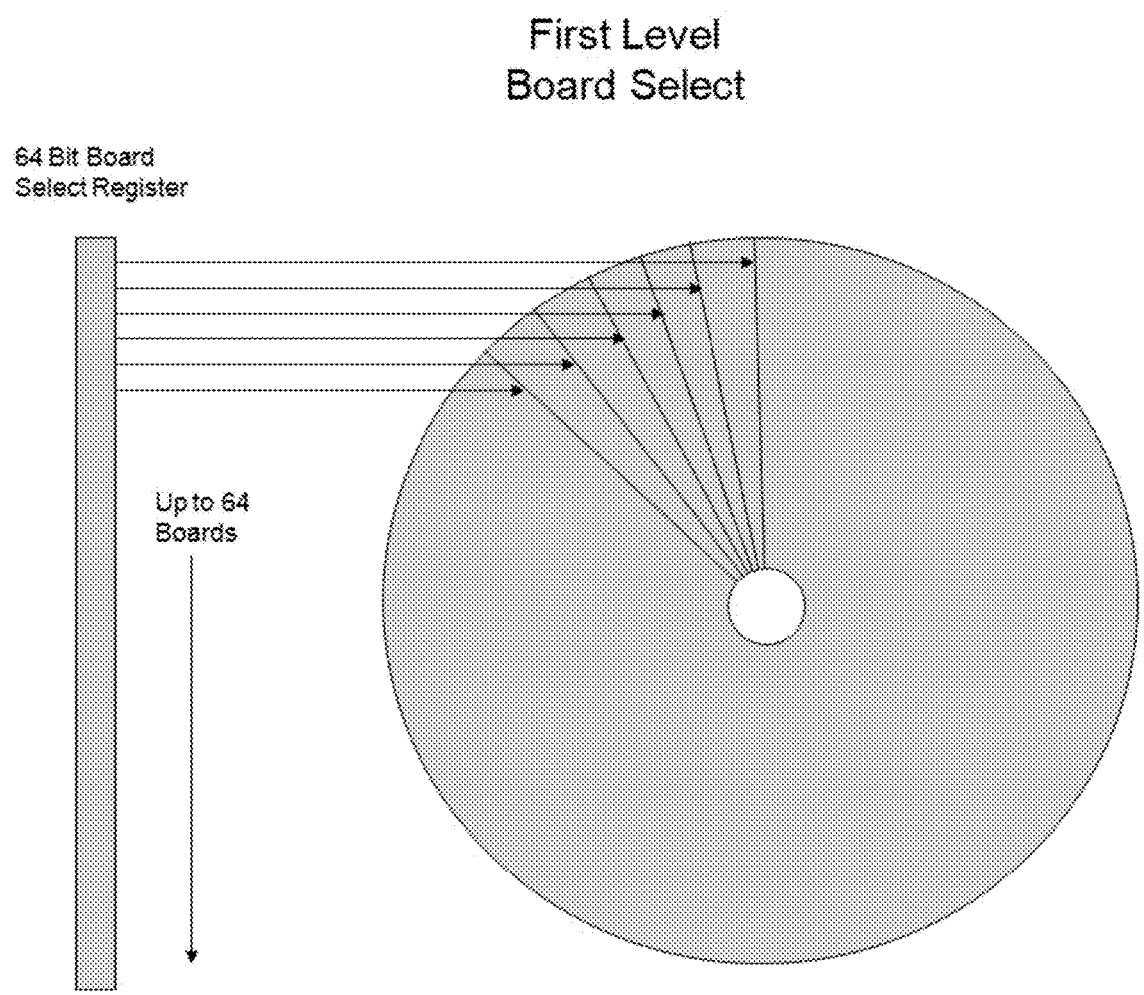
Figure 3E:
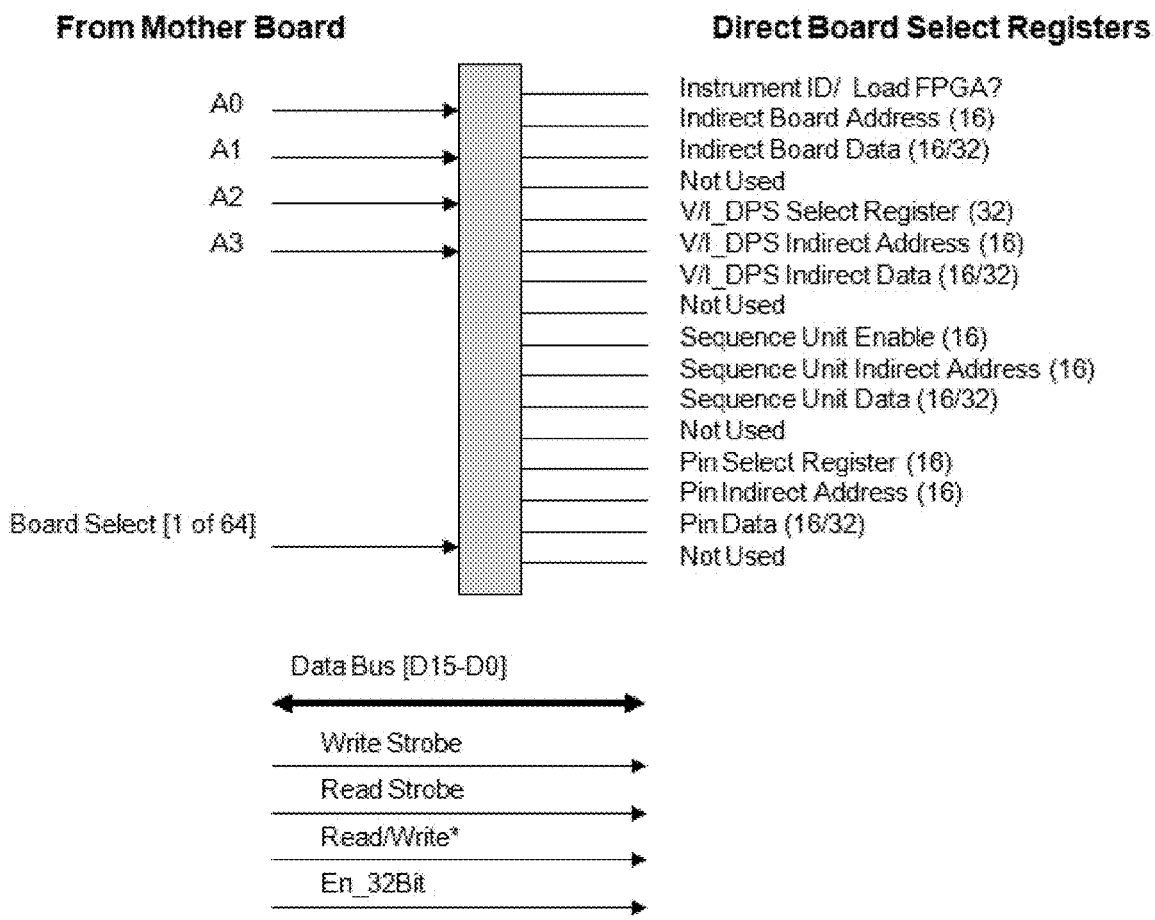
Figure 3F:
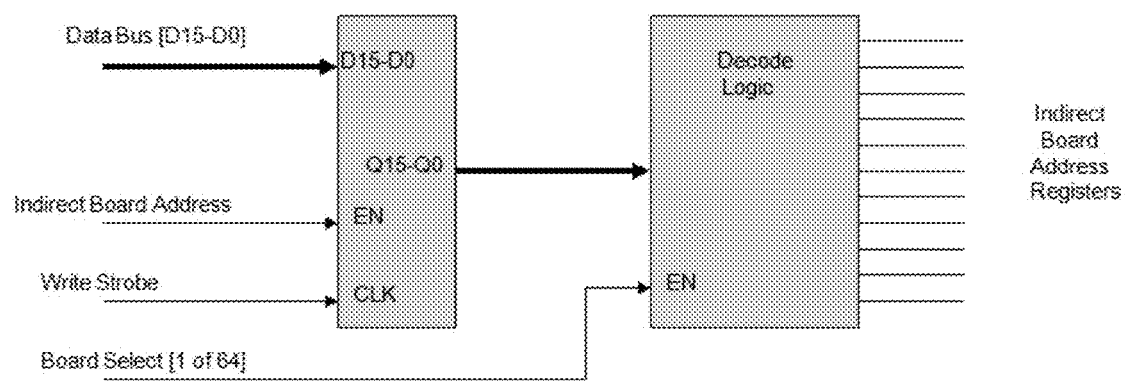
Figure 3G:
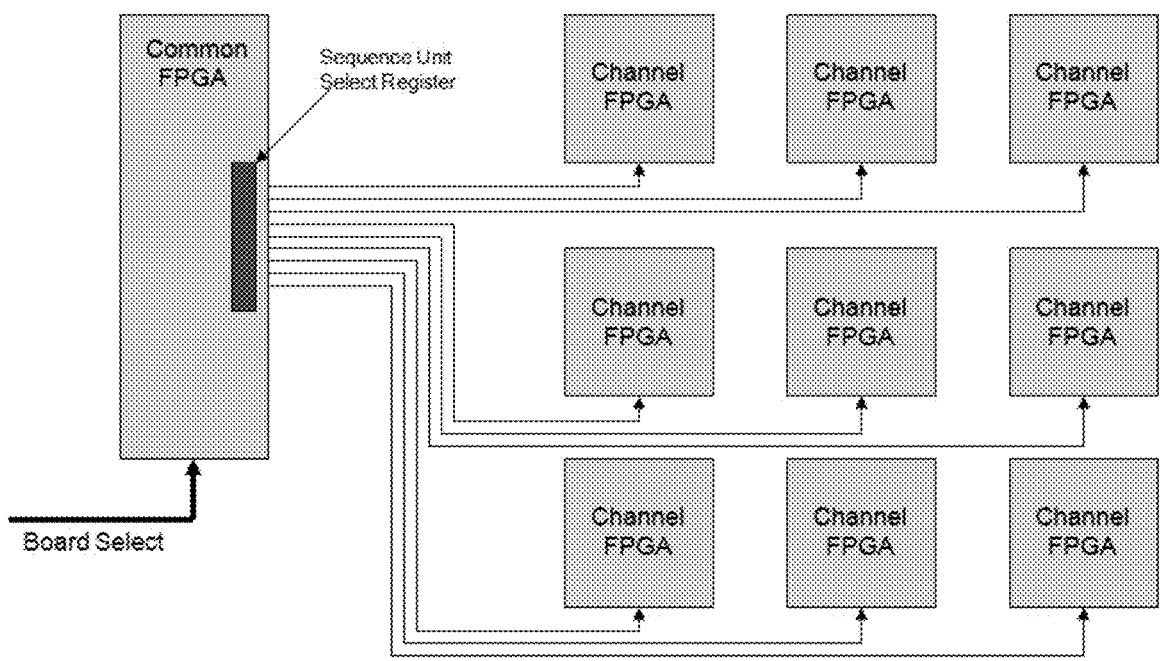
Figure 3H:
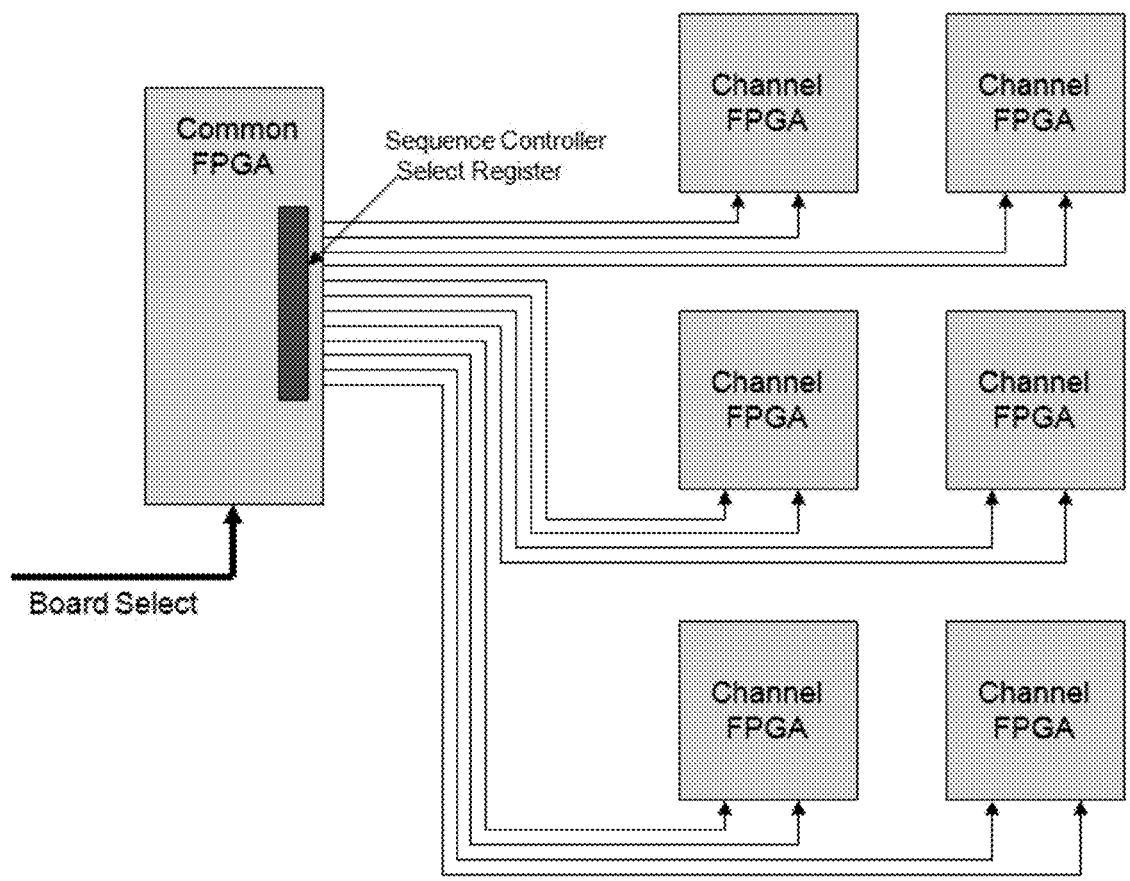
Figure 31:
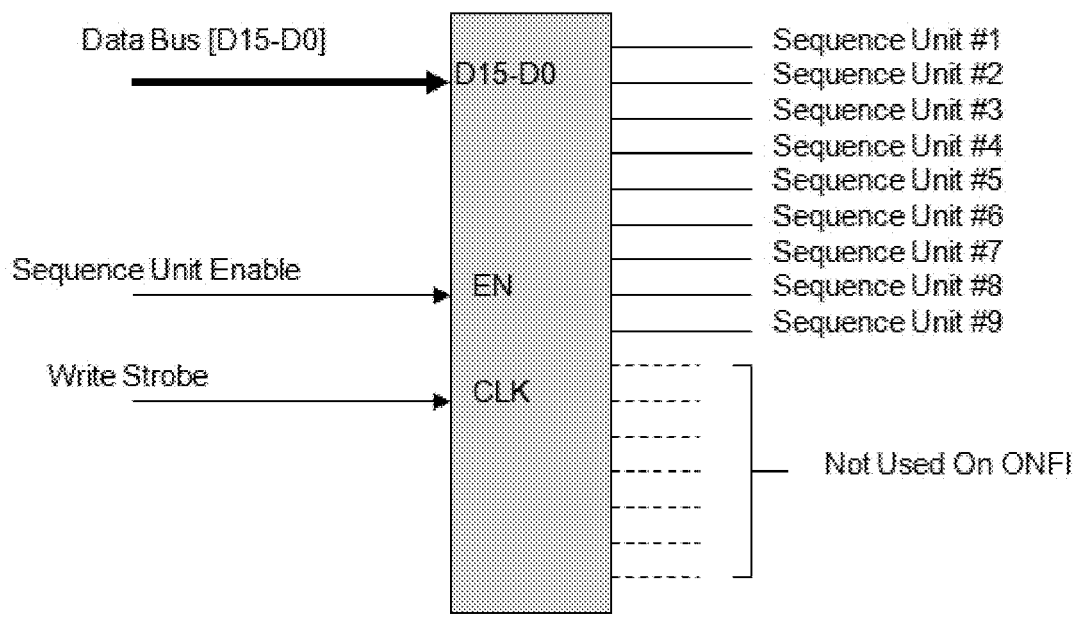
Figure 3J:
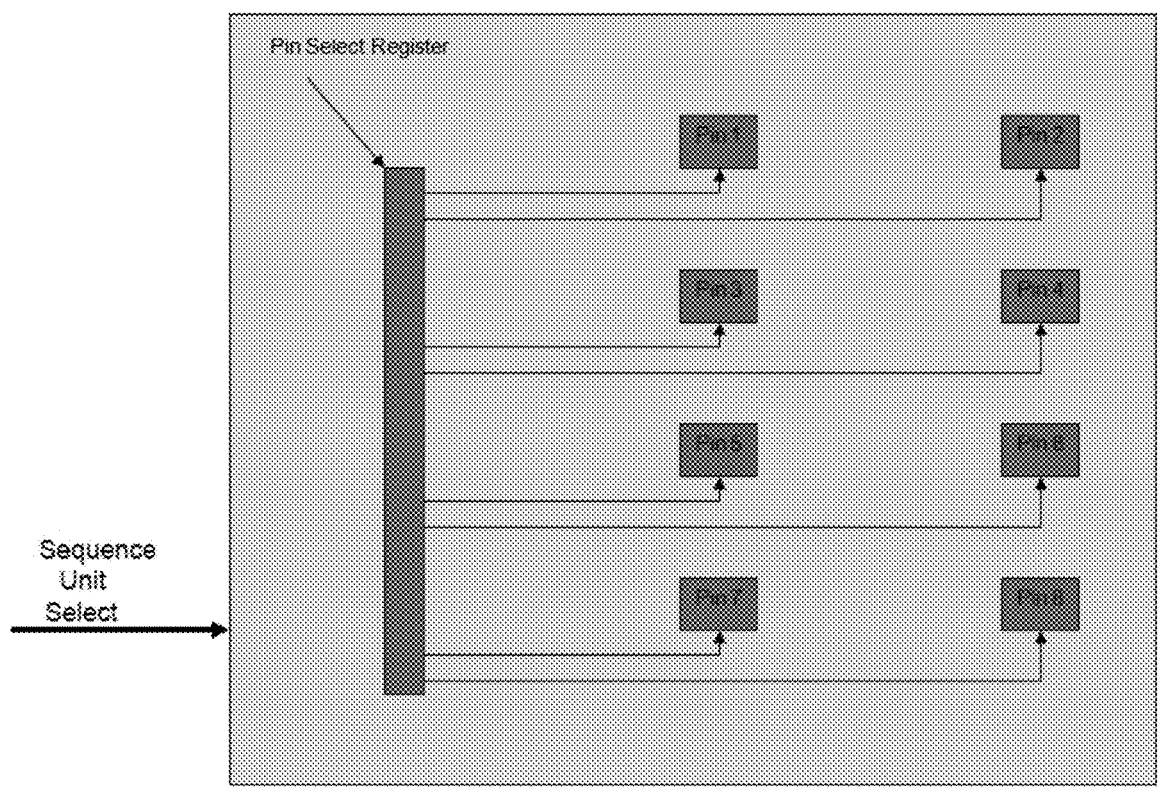
Figure 3K:
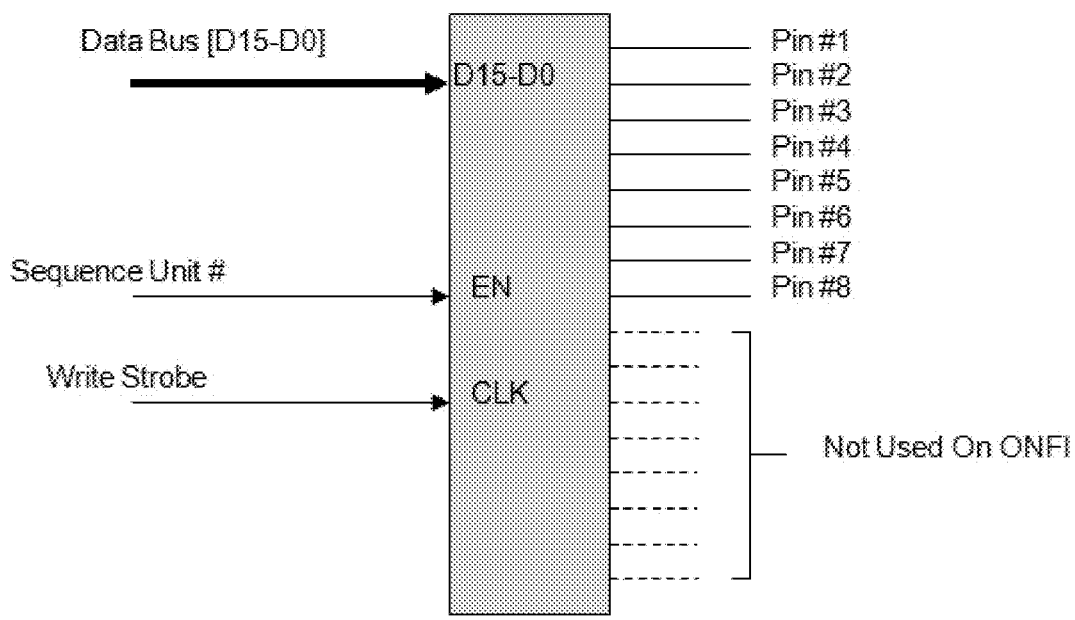

FIG. 3B shows an exemplary arrangement for minimizing noise for multiple blade instruments. The system is designed from the start with the best possible noise isolation presented to the Device Under Test (DUT). The system contains 3 ground systems. The first is the Host Computer ground system, which should be avoided at the DUT. To accomplish this the system references the Host to Tester communication at the Host Computer ground potential. On each Blade isolation is provided for all the Digital and Analog circuits using 2 novel methods. The first method isolates the communication to the digital and digital input for the analog circuits. This isolated digital data is then referenced to an isolated digital ground. This ground potential is referred to as the digital isolated ground. In addition the system isolates the analog circuits from the digital isolated ground using an analog isolated ground reference. These isolated grounds are only tied together at the DUT. This prevents noisy ground currents from affecting the critical circuits on the Blade or at the DUT. The actual means of isolating these grounds is accomplished using DC to DC converters with a transformer to provide isolation between the primary and secondary. The power system architecture is a distributed 48 volts to all Blades with the isolation DC to DC converters providing the isolated lower voltages as required. The DC to DC converter transformers are implemented using windings provided by the multilayer PCB with a transformer core that clamps to the PCB. In one PCIe implementation, the following grounding scheme is used:

1. Most Instruments will have an Isolated Digital and an Isolated Analog. These will need to be tied together at the DUT.
2. The USB_GND will also need to be tied to the DUT ground if used.
3. The Slot#1 CAL ground signals on Ardent Block "A" pins A1 and A2 should only be required for Calibration and are not required to be tied to the DUT ground.
4. The User Sync associated Isolated Digital ground Ardent Block "B" pins B25 and B26 is only provided for a Scope sync. This signal is only available from selected Digital Instruments and should not be tied to the DUT ground. The User Sync signal and the grounds should go to a set of test points.
5. The GND_POWER on the 25th Connector pins 4, 5, and 6 is only used when controller device V48LB is required to generate special voltages on the DUT card. It should not be tied to the DUT ground.

FIGS. 3C-3K show an exemplary hierarchical interface architecture for mapping test addresses. Most Test Systems memory map the hardware within the range of the computer memory. In the past this has always become a problem when the maximum allowed memory is exceeded. This is usually caused by the stored pattern memory becoming larger than the Computer can access. When this happens special operations are required such as Memory Paging or similar schemes. The preferred architecture only memory maps a small amount of specific hardware. This scheme allows virtually unlimited test memory size. In a memory mapped architecture only 1 memory address can be accessed at any single time. This means each used pattern memory locations needs to be loaded with Test Pattern data. The instant architecture solves this problem by loading multiple locations at once.

The instant system starts by assigning each Instrument a unique Instrument Enable, or Blade Enable or Blade Select Register. Using this technique multiple Blades can be selected. For example, the Cobra5 has 5 Blade selects, The Cobra24 has 24 and the Cobra64 has 64. These are unique wires on a Top Hat PCB. The second level of hierarchical selection is the Direct Board (Blade) Select registers. There are 16 of these registers assigned to each Blade. The Blade hardware and software define the purpose of these registers. As an example the General Logic Blade has the following assignment:

0 Instrument ID (normally Read Only)
1 Indirect Board Address
2 Indirect Board Data
3 Not Used
4 V/I_DPS Select Register
5 V/I_DPS Indirect Address Register
6 V/I_DPS Indirect Data Register
7 Not Used
8 Sequence Unit Enable Select
9 Sequence Unit Indirect Address
10 Sequence Unit Indirect Address
11 Not Used
12 Pin Select Register
13 Pin Indirect Address Register
14 Pin Indirect Data Register
15 Not Used The Indirect Address Registers eliminate the memory mapped hardware limitation by allowing 4 16 bit addresses for each Blade. This could actually be expanded if required. The Select Registers are the basis for our increased Tester efficiency. Since these Select Registers can have multiple selections, locations that require the same information can be loaded at the same time. This is very important in testing devices in parallel. The architecture of our tester is actually a tester for every 8 pins. This allows each group of 8 tester pins to be independent. The best case scenario is testing an 8 digital pin device. That would mean each GLB (General Logic Blade) would be able to test 10 devices. If the test pattern was 1 Meg deep, the system could load the multiple devices in a single pattern load. Other test systems would require loading 10× pattern memory for a 10× load time. If we have 5 Blades in our Cobra5 system and they are testing 8 pin digital devices the system still only needs a single pattern load. In this case other systems would require 50× pattern load time. Thus, the advantage could become very significant.

The Sequence Unit Enable Select register selects up to 16 independent Sequence Controllers. The GLB has 10 Sequence Control Units. The Sequence Control Unit controls 8 digital pins. This is what creates our 8 pin tester architecture. These Sequence Controllers can be independent or concatenated with adjacent Sequence Controllers. This is required to test devices with larger than 8 digital pins. We have also provided for the concatenation between the Blade Instruments. This would be required for testing devices with more than 80 digital pins or test multiple devices that require partitions that span Blade Instruments. Since each Sequence Controller can be connected to the adjacent Sequence Controller and span adjacent Blades Instruments, and since the Cobra24 and Cobra64 are arranged in a circular configuration, we have a Circular Array of 8 Pin Testers. Unfortunately the Cobra5 is not circular so the last Blade does not communicate easily with the first Blade. This could be fixed on a later revision if required.

The final level of digital selection is by pin. The Pin Select Register allows multiple pins to be selected within each Sequence Controller. On the GLB there are 8 pins for each Sequence Controller but plans have been discussed where a Digital Blade would contain 16 digital pins for each Sequence Controller. This would then become an array of 16 pin testers.

A similar structure is provided with the Device Power Supplies. There are 20 DPS (Device Power Supply) supplies arranged in 5 groups of 4. Again the V/I_DPS Select Register can have multiple selections allowing the same data to program several supplies. Each of these supplies requires a gain and offset calibration. This information is stored in additional hardware to allow the same programmed value to be written to each supply as required. The modification of that value is done by the calibration circuits to make the actual applied values correct at the DUT.

All of these functions can be expanded if required using the unused Direct Board Registers. In one exemplary direct register mapping, the following is used

| | |
|---|---|
| 0000 | Instrument ID |
| 0001 | Indirect Board Address |
| 0010 | Indirect Board Data |
| 0011 | |
| 0100 | F1(V/I_DPS Select Register) |
| 0101 | F1(V/I_DPS Indirect Address) |
| 0110 | F1(V/I_DPS Indirect Data) |
| 0111 | |
| 1000 | F0(Sequence Unit Enable) |
| 1001 | F0(Sequence Unit Indirect Address) |
| 1010 | F0(Sequence Unit Indirect Data) |
| 1011 | |
| 1100 | F2(Pin Select Register) |
| 1101 | F2(Pin Indirect Address) |
| 1110 | F2(Pin Indirect Data) |
| 1111 | |

Referring now to FIG. 4A, the central power distribution system 330 is detailed. In this system, a master power generator is placed at the center of the blades. In one exemplary embodiment, the power generator provides 48V volts to all tester blades, and each tester blade in turn converts the 48V up or down as needed.

FIG. 4B shows an exemplary electrical distribution scheme for the system of FIG. 4A. The gray lines signify "dirty" and the blue is a "clean" environment. In this system, AC power is provided to a computer such as a Linux PC that drives an unfiltered high speed communication bus and a DC power supply that generates unfiltered non-lethal DC voltage, both of which are provided to a blade mechanical enclosure. Circuits in each blade extract an isolated high speed communication data for a particular tester blade n. Power circuits in each blade provide transformer based power isolation and locally generated power supplies that provide clean local power for each tester blade n. Such isolated communication and power buses are supplied to the DUT interface that in turn drives the DUT. In this manner, the Cobra instruments are completely isolated from the overall system and any other instrument. This DC isolation eliminates the possibility of parasitic current paths that limit the stability of non-isolated systems. DC stability maximizes the reproducibility of digital and analog circuits alike—the DUTs get the same performance day-after-day, with no negative surprises.

Figure 4C:
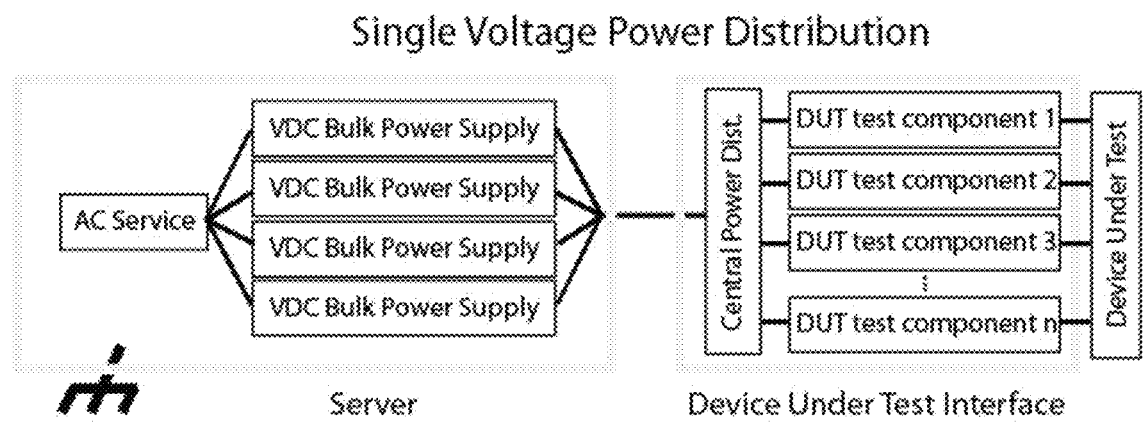
FIG. 4C shows another embodiment of the electrical distribution system.

FIG. 4C shows another embodiment of the electrical distribution system. In this embodiment, a simplified distribution of a single DC voltage is provided to be distributed to all major components of the system. The power network is regulated and kelvin sensed to provide a stable, reliable, bulk power source. One or more bulk supplies are located in a remote chassis for ease of service and replacement. The AC control module is configured for the country of use, containing all of the functions required to turn the system on and off and provide necessary safety elements (e.g. emergency power down). The power is delivered to the Device Under Test (DUT) electronics via a bundled cable of power and communication wires. The individual voltages required by a given DUT electronic component are created directly on that DUT electronics' component. This assures that all instruments have the precise set of voltages and currents desired, in a low-noise environment. This arrangement provides a simplified power distribution to provide a more reliable ATE system by limiting the diversity of bulk power supplies to one voltage. The custom tailored power requirements for now and the future based upon a single voltage reference provided to all major components of Automatic Test Equipment. Power distribution of a single voltage reference has been historically impractical to implement given the circuit demands of Automatic Test Equipment, but this is made possible using the centralized power distribution of the present system.

FIG. 5 shows one embodiment of a central clock distribution system. The clock system includes a central reference clock origin point 410 with zero skew clock connection 412 to a clock/sync connector 414 that is connected to one or more sync buses 416. Each instrument utilizes the Central Reference Clock (CRC) to coordinate its testing process with all the other instruments. The CRC starts each test sequence and provides a single frequency reference. Each Cobra Blade is free to utilize the CRC as its master clock or augment it with "On-Blade" enhanced clocking. These enhanced clocks allow different blades to run at different frequencies. It can be said that each Cobra Blade can run in its own "Time Space". Test sequences can be created where different DUT ports are tested with a unique timing reference. Advanced problems such as arbitration logic testing suddenly become simple and easy to solve.

Each blade is electrically isolated from all others, yet can communicate with each other during testing by use of a sophisticated system of synchronization. A multi-level sync bus, allows the blades to precisely signal each other to coordinate their testing sequences. Sync Events can be used for combining error lines or to lock two Cobra Blades together in time.

In some cases a single blade could control the sync for all the instruments. Or, repetitive groups of blades could be linked together for high-throughput, parallel testing—whatever configuration best supports the testing approach being used.

In the case of very small pin count devices, each blade can act alone in testing the devices it is connect to, without waiting for the results from others. This can improve the system's production capacity by 5% or more in some cases—a significant economic advantage for customers.

FIGS. 5B-5J show one exemplary Clocking System architecture that uses both central and distributed clocks. The Master Clock Board provides three very accurate and stable clocks. In one embodiment, a crystal controlled Reference Clock is generated from a 125 MHz crystal oscillator. The system divides this frequency by 2 to provide the 62.5 MHz system reference clock. Dividing the clock by 2 removes any bi-modal distortion from the final reference. This clock is buffered and distributed to the Blades in a "Star Configuration" with matched transmission lines on the Master Clock board and the Backplane. This clock is used on the Blades for all the serial communication to the digital and analog circuits. The Master Clock divides the 62.5 MHz by 2 to provide a 31.25 MHz reference to the Host Interface Board. The 31.25 MHz reference is provided on the ribbon cable connecting the Top Hat Circuit Board to the Master Clock Board. The second clock is provided by a DDS circuit which generates the Master Clock variable frequency. This clock frequency is from 80 MHz to 120 MHz. It has a resolution of 2 hertz. The 120 MHz to 80 MHz range allows the selection of any Vector Rate frequency from 1.2 KHz to 50 MHz with 2 hertz resolution. The DDS circuit uses a bandpass filter to remove unwanted frequencies and a high speed comparator to create a digital square wave. This Master Clock is also distributed to the Blades in a "Star Configuration" with matched transmission lines. It is used by each Sequence Controller on the GLB to be divided as the Vector Rate Clock or TZero clock. The third clock is also 62.5 MHz but is sourced from the DDS circuit to provide known phase alignment with the internal DDS clocks. It is also distributed to the Blades in a "Star Configuration" with matched transmission lines. This clock is only required for starting an optional Master Clock Module located on each Blade. This allows integer related or non-integer related clocks for specific testing requirements. There are also control signals to guarantee synchronous operation. These are I/O Update, Clock Start and Clock Stop.

The system incorporates extensive synchronization hardware and software. In addition to the clocking synchronization mentioned earlier there are multiple Instrument synchronization signals. The Instrument synchronization is used to communicate between the Blades. This allows digital hardware to initiate and respond to analog hardware. The reverse is also true. The digital hardware can request the analog hardware to make a measurement and the analog hardware can indicate to the digital hardware when the measurement is complete. Many examples of the Blade interaction are possible. The Instrument synchronization is partitioned by performance capability. The highest performance is called "Segmented Multisource". These signals are used for the Error signals and Sync1. These signals have the lowest propagation delays and can be sourced from multiple locations. The actual hardware design uses differential ECL wire or signaling. The partitioning capability is provided by the backplane and the Blade. These signals can drive or receive from the previous or next Blade Instrument. The backplane provides a previous or next signal to the Blade. The Blade can connect these together to provide a continuous signal along the backplane or break the connection to create independent previous and next signals. The Sync1 signal is not as programmable as the other Sync signals but does have the highest performance. The second highest performance synchronization signal is the Segmented Single Source. There are 8 of these signals labeled Sync2 through Sync9. They can be segmented in the same manner as the Sync1 signal, but there can only be a single driving source. There can be multiple receiving destinations. These signal are also differential but are not wire or. The signaling level is Bus Low Voltage Differential Signaling (BLVDS). The Blade determines where the source drive originates and where the destination terminates. This selection is made by the Host. The Host programs multiplexors in the Digital Spartan3 FPGA, and enables the drive and receive buffers on the Blade. The last synchronization signal type is the General Purpose Continuous Sync. There are 8 of these signals labeled Sync10 through Sync17. They cannot be segmented and run the length of the backplane. They are BLVDS and can only have a single driving source. There can be multiple receive destinations. These are the lowest performance sync lines.

Figure 5A:
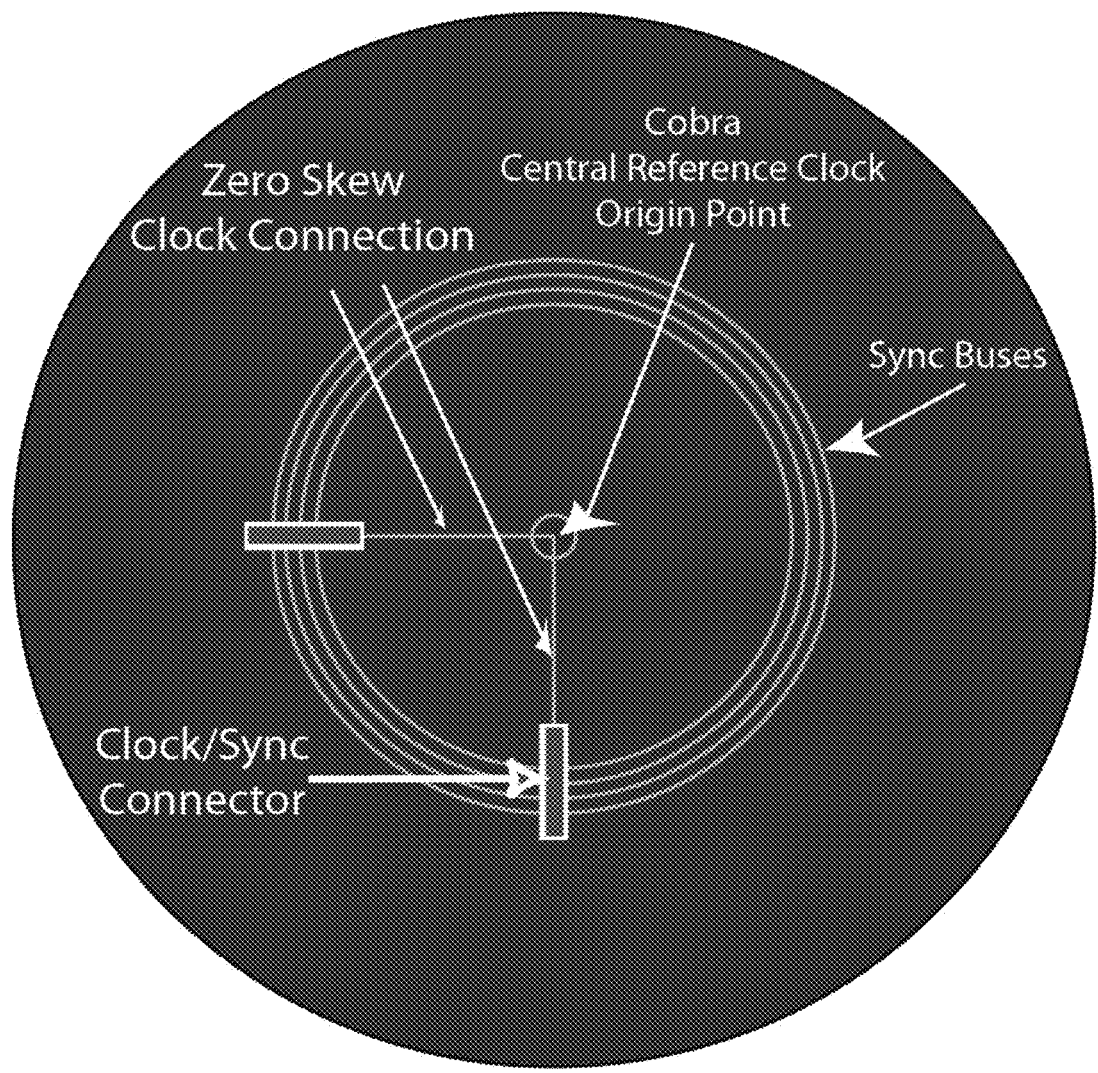
Figure 5B:
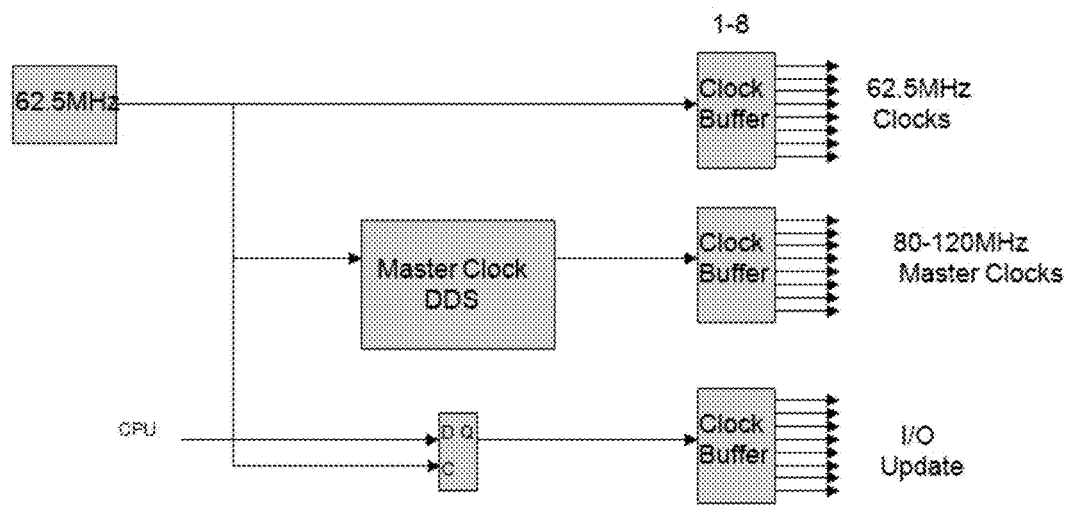
Figure 5C:
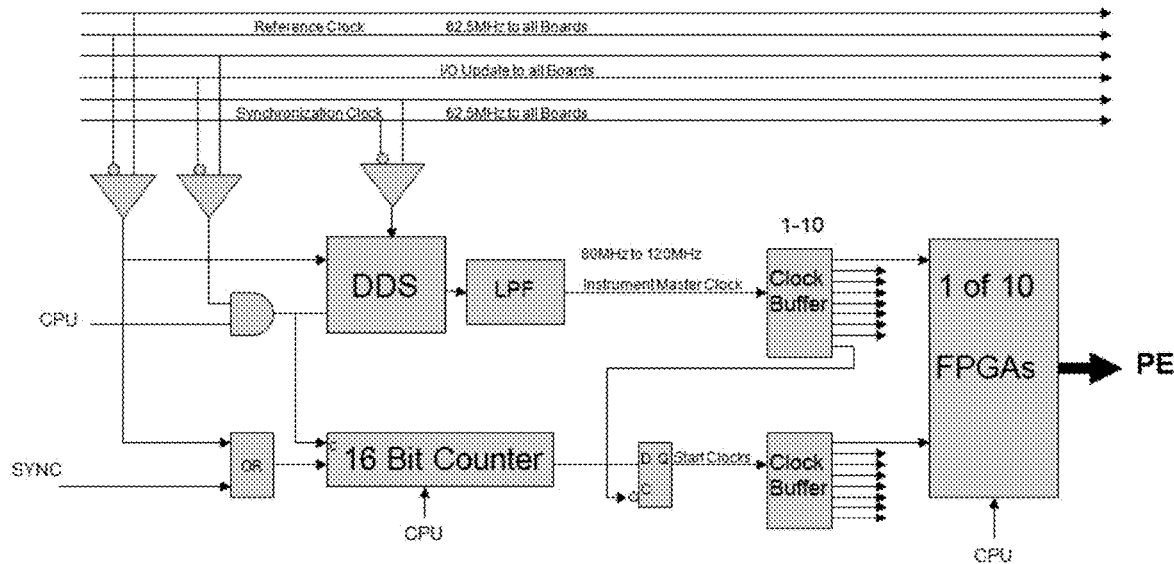
Figure 5D:
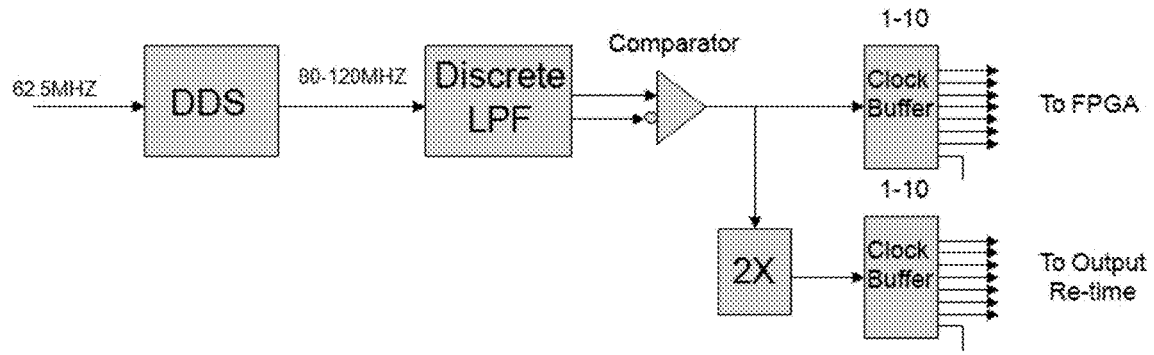
Figure 5E:
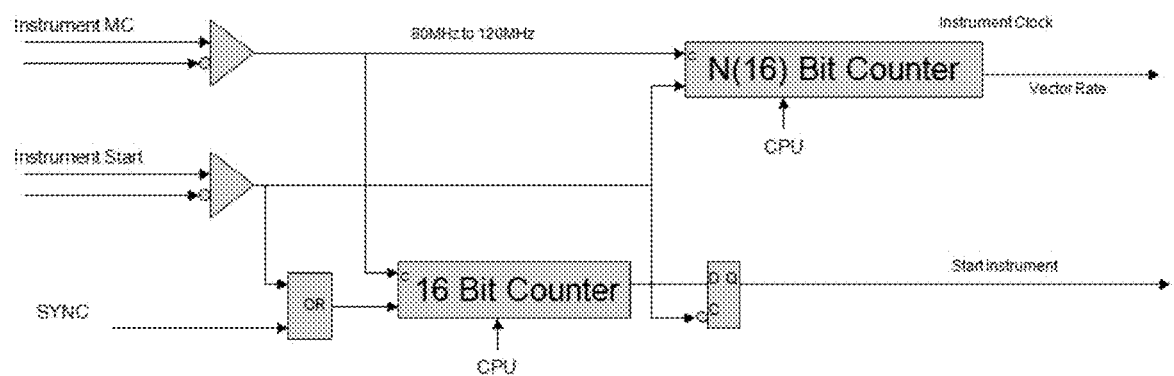
Figure 5F:
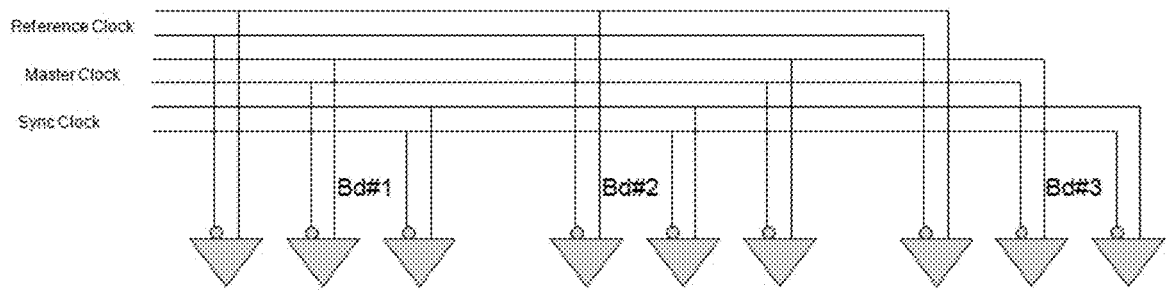
Figure 5G:
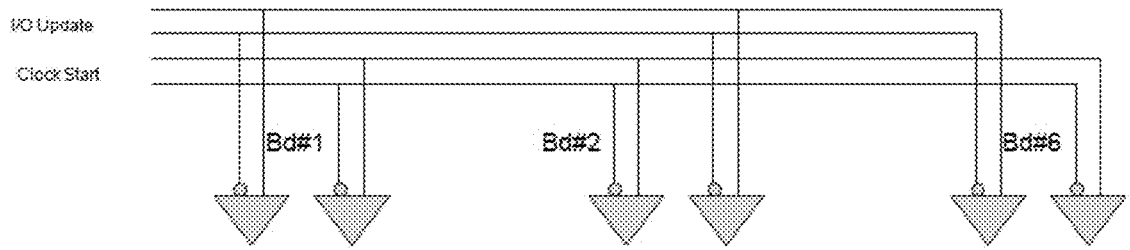
Figure 5J:
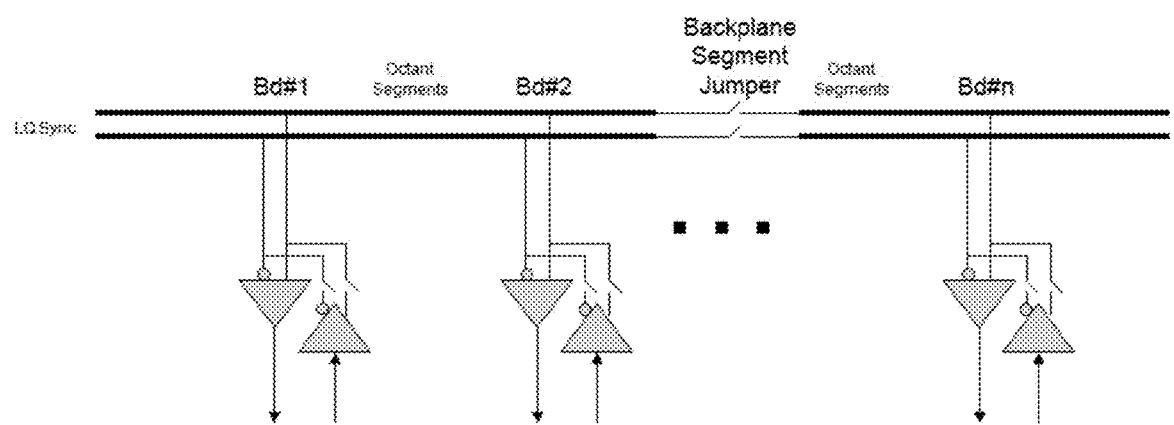
Figure 5K:
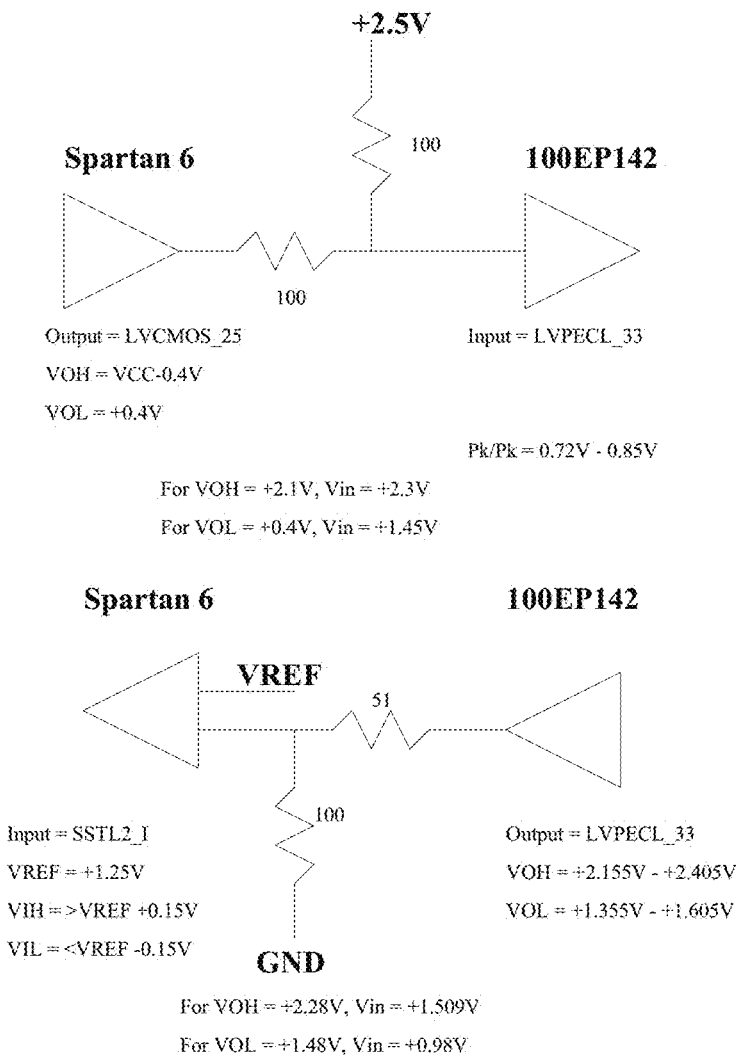

FIG. 5K shows an exemplary skew handling system. One set of timing consideration is the interface between the 100EP142 Low Voltage Positive Emitter Coupled Logic (LVPECL) and the input of the PCIe Driver/Receiver IC. Since the output voltage levels of the PCIe driver are is subject to variation due to temperature, FPGA process, and propagation delay mismatch the system provides a method to account for some of the variations. The system uses a differential output Q7 to sum the high and low level voltage through equal value resistors to determine the exact center of these 2 levels. The system uses this center voltage as the reference voltage input for the Mercury IC. This provides voltage tracking of the two devices eliminating timing skew.

The various systems incorporate vector rate timing generated with an FPGA. This timing is subject to variation due to temperature, FPGA process, and propagation delay mismatch. The system uses a retiming scheme that I believe in unique in the Test Industry. The FPGA needs to interface to (LVPECL) through Low Voltage CMOS (LVCMOS) for the outputs from the FPGA device.

This provides a Voltage Out High (VOH) of 2.1 volts.
Voltage Out Low (VOL) will be 0.4 volts.
A 100 ohm series resistor with a second 100 ohm resistor to +2.5 volts is inserted, and the junction feeds the LVPECL input of an 100EP142 register.
The resulting levels for the 100EP142 inputs are Voltage In High (VIH)=2.3 volts
The resulting levels for the 100EP142 inputs are Voltage In Low (VIL)=1.45 volts
Input level specification on the 100EP142 is (VIH)=2.075 to 2.42 volts and (VIL)=1.355 to 1.675 volts
To interface from the 100EP142 to the FGPA the system performs the following:
Voltage Out High (VOH) for the 100EP142 is 2.155 to 2.405 volts.
Voltage Out Low (VOL) for the 100EP142 is 1.355 to 1.605 volts.
The system uses a 51 ohm series resistor with a second 100 ohm resistor to ground. The junction feeds the FPGA input with the input selected to be SSTL2_I.
The resulting levels for the FPGA inputs are Voltage In High (VIH)=1.509 volts
The resulting levels for the FPGA inputs are Voltage In Low (VIL)=0.98 volts
Input level specification for the FPGA are VIH=VReference+0.15 volts and VIL=VReference−0.15 volts
The VReference is set to 1.25 volts.
The input voltage has a symmetrical swing around the VReference voltage.
The retiming PCIe driver registers are clocked at 2× the Master Clock frequency to provide a 5 nS Re-Time clock. The system automatically adjusts all the FPGA outputs within this embodiment's 5 nS window.

An Isolated Serial Communication architecture is detailed next. To speed up the serial communication across the isolated boundary we have decided to send the 32 bits of data in 4 groups of 8. By using this method it only takes 8 serial clocks (62.5 MHz) instead of 32 clocks. This did however create a situation where the propagation delay between the 4 channel ISO7240 ICs could cause a skew of data so the clocking would not be reliable. The system handles this issue by sending 2 serial data streams with an associated clock through each ISO7240 device. Since the data and clock will now be delayed the same amount the clock skew issue was resolved. During the readback of Blade data a similar situation arose. The system loops the clock signal back through the ISO7240 devices so it would also track the data path. The readback can be optimized on the GLB since it requires 35 clocks instead of the write cycle which only requires 8.

Next, system calibration is detailed. Calibration is a consideration that must be designed into both the hardware and software. The Blade design incorporates special calibration hardware to allow the software to perform the calibration procedures. In all Cobra Systems the Blade located in Slot or Blade position #1 will have calibration hardware enabled. This provides a single reference timing signal for the entire system. The system Master Clock (80-120 MHz) and system Reference Clock (62.5 MHz) can be selected to drive a differential LVPECL signal to DUT board. This signal is only available from the Blade in Blade position #1. A User Sync clock can also be selected by the host to provide a synchronizing signal for test program debug. This signal is available on each Blade Instrument if required.

Next, the software components for communicating with the test hardware is detailed.

Figure 6A:
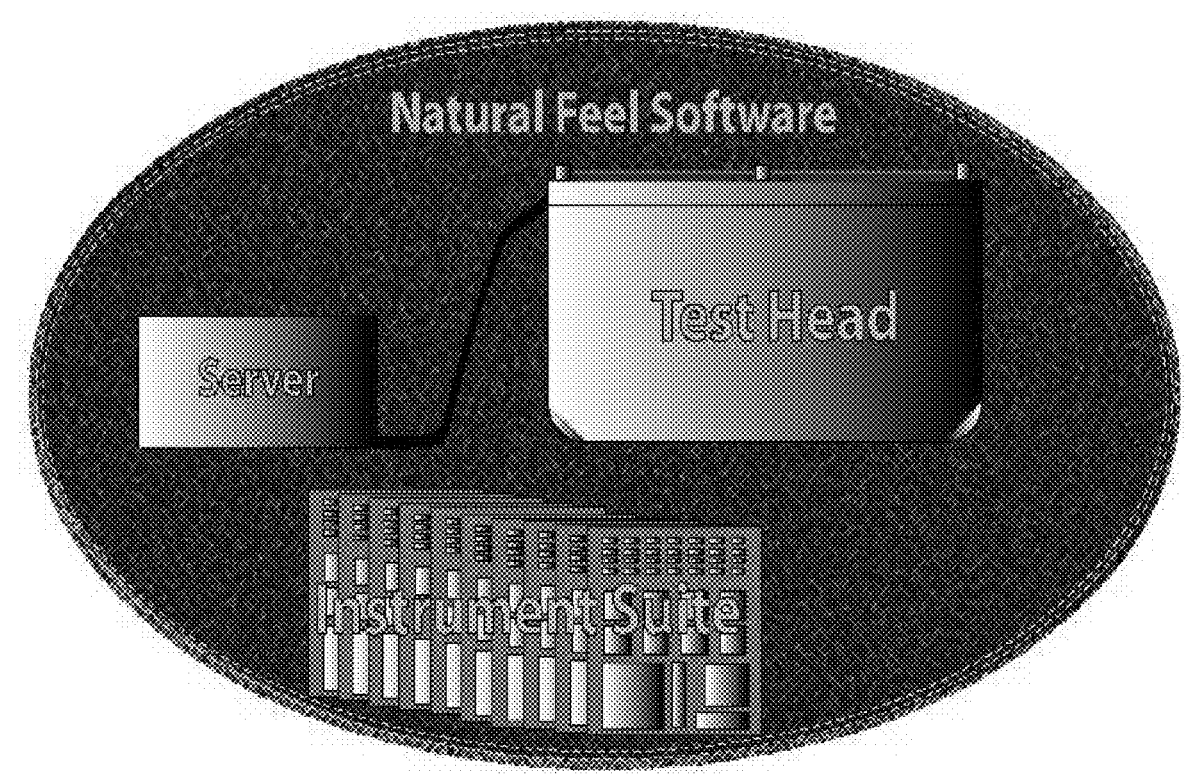
Figure 6B:
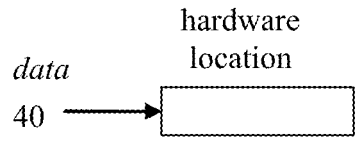
Figure 6C:
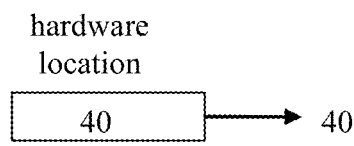
Figure 6D:
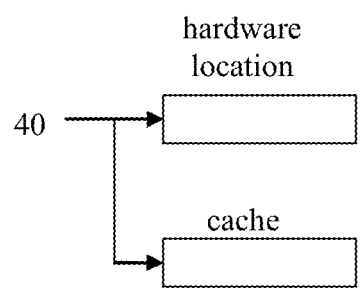
Figure 6E:
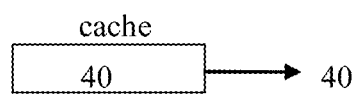

FIG. 6A shows one implementation of Cobra with four basic product groups: the Testhead, the Sever, a Suite of Blades, and Test Software to tie the hardware together. The system uses many software registers and they belong to a C++ hierarchy. Each software register knows how to do two things; read and write.

The basic register can perform reads and writes to a specific hardware location, as illustrated in FIGS. 6B-6E. Every register may be tagged as volatile or nonvolatile. Volatile indicates that the value in the register may change on its own, without tester intervention. Most Cobra registers are nonvolatile.

The cache is simply a memory location used by the register to keep a copy of the data last written to the register. Each register has its own cache. Reading from the cache is much faster than reading from hardware. Also, redundant writes to hardware can be optimized out by realizing that the data to be written already matches the data in cache. The use of caches thus provides greater I/O performance. These are the building blocks for all of various register types. A new object, a register list, is used which is a list of one or more registers. A register list can also perform read and write operations. A register list read returns a list of data, one value for each register in the list. Register list writes come in two forms. One form takes a single data value to be written to all registers. The other takes a list of data, one value for each register.

Default register list read procedure
  For each register in list
  Perform register read
Default register list write procedure (one value)
  For each register in list
  Perform register write
Default register list write procedure (value list)
  For each register & data in list
  Perform register write One embodiment constrains register lists to only contain registers of the same type.

Figure 6F:
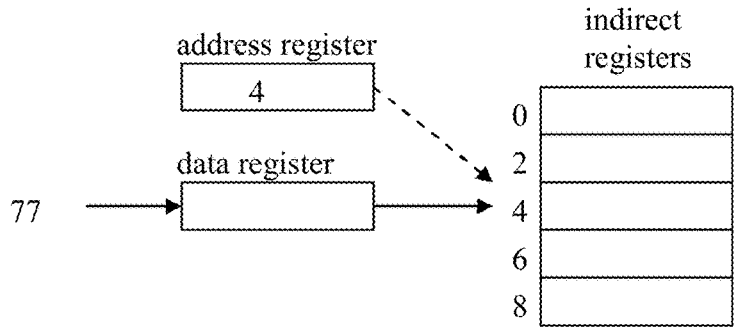

An indirect register is read/written through two hardware locations referred to as the address register and the data register, as shown in FIG. 6F The value in the address register points to an indirect register location. Data written to the data register will be forwarded to the indirect register pointed to. Likewise, data read from the data register will be read from indirect register that is pointed to.

The use of indirect registers allows an unlimited amount of indirect registers with just a few real address lines. Most of the system's registers are indirect. The software indirect register has pointers to two other software registers. One is named the address register and the other is named the data register.

Indirect register write procedure
Tell the address register to write the value which is my indirect address.
Tell the data register to write the data I want to write.
Indirect register read procedure
Tell the address register to write the value which is my indirect address.
Tell the data register to read.

Like indirect registers, selectable registers have a data register through which reads and writes are performed indirectly. A select register determines the location(s) that will be targeted from the data register.

Figure 6G:
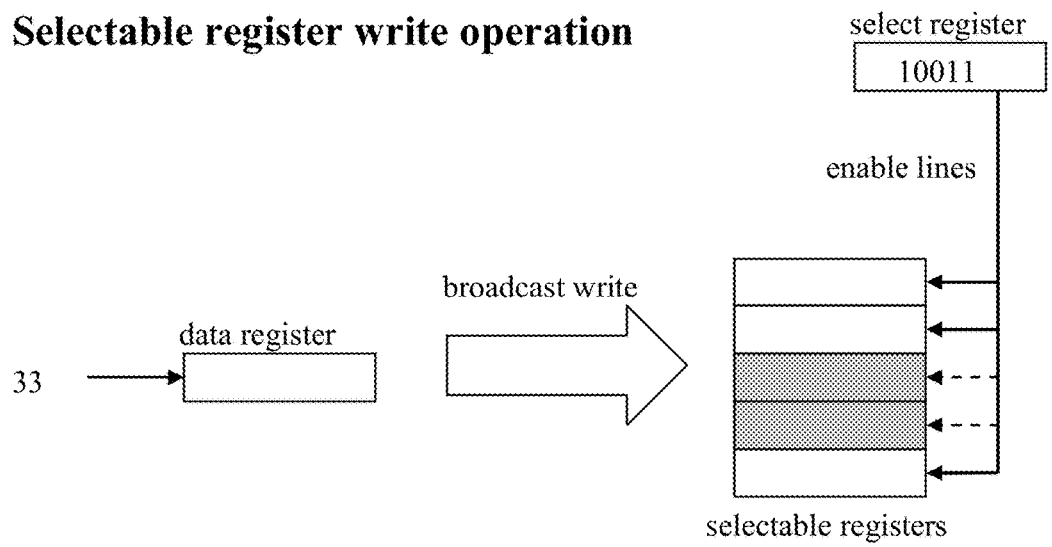

FIG. 6G shows the select register containing the binary value 10011. The bits are connected to enable lines on the selectable registers. There is one bit for each selectable register. If that bit is a zero, the selectable register does not respond. If it is a one, it does respond.

For read operations, software must ensure that only one bit is set in the select register to avoid bus collisions. For write operations, however, any number of bits may be set. This allows the broadcast write capability illustrated above.

In software, the selectable register type is almost identical to the indirect register type. It has pointers to two other software registers. One is named the select register and the other is named the data register.

Selectable register write procedure
Tell the select register to write the bit which selects my selectable register.
Tell the data register to write the data I want to write.
Selectable register read procedure
Tell the select register to write the bit which selects my selectable register.
Tell the data register to read.

Selectable registers are used heavily in the instant system. It starts with the host interface board which has a select register for every instrument card slot in the system. This select register must be set before doing any I/O to Cobra instruments. It also means that any write operation that an instrument supports may be broadcast simultaneously to multiple instruments.

Figure 6H:
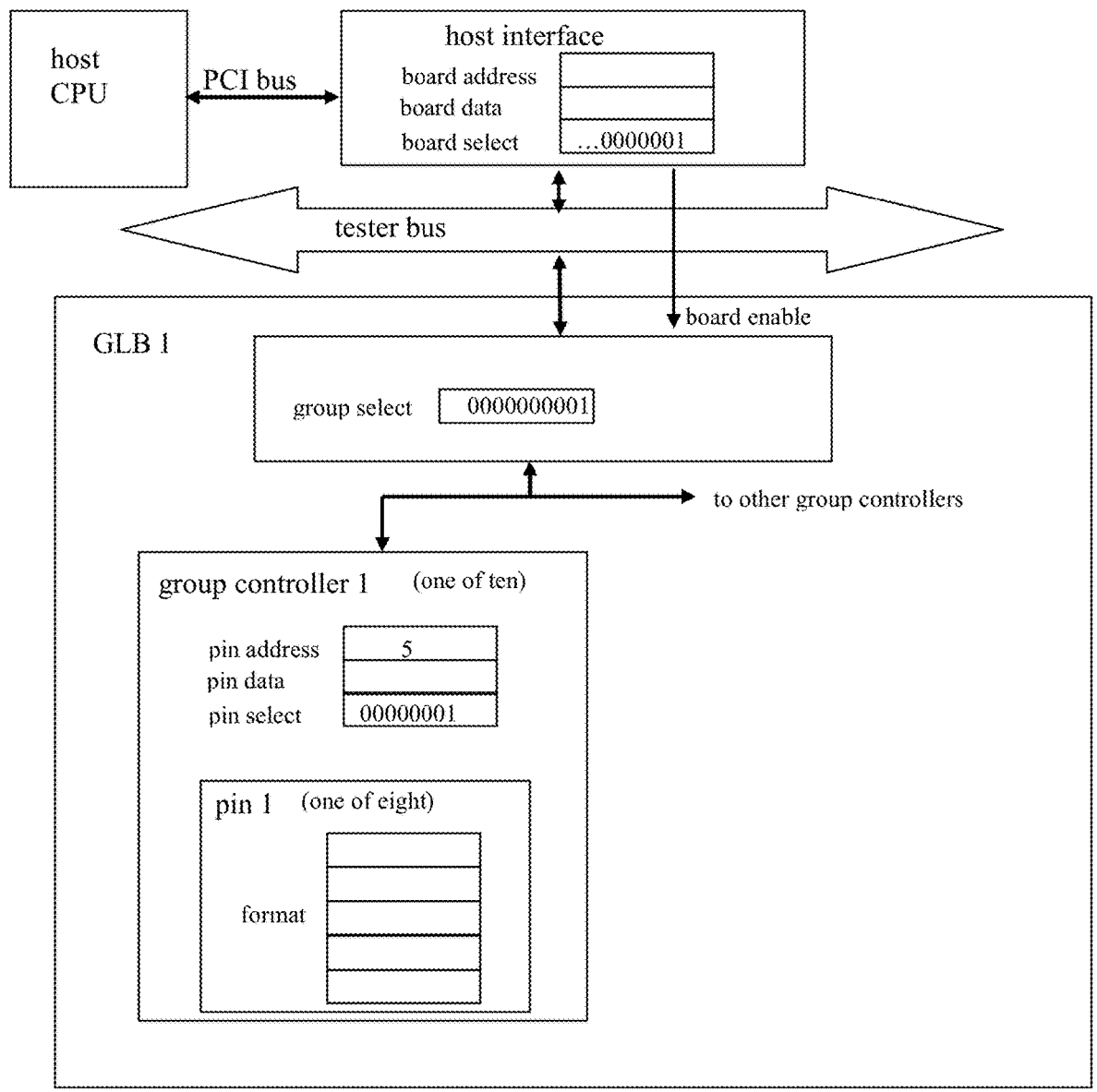
Figure 61:
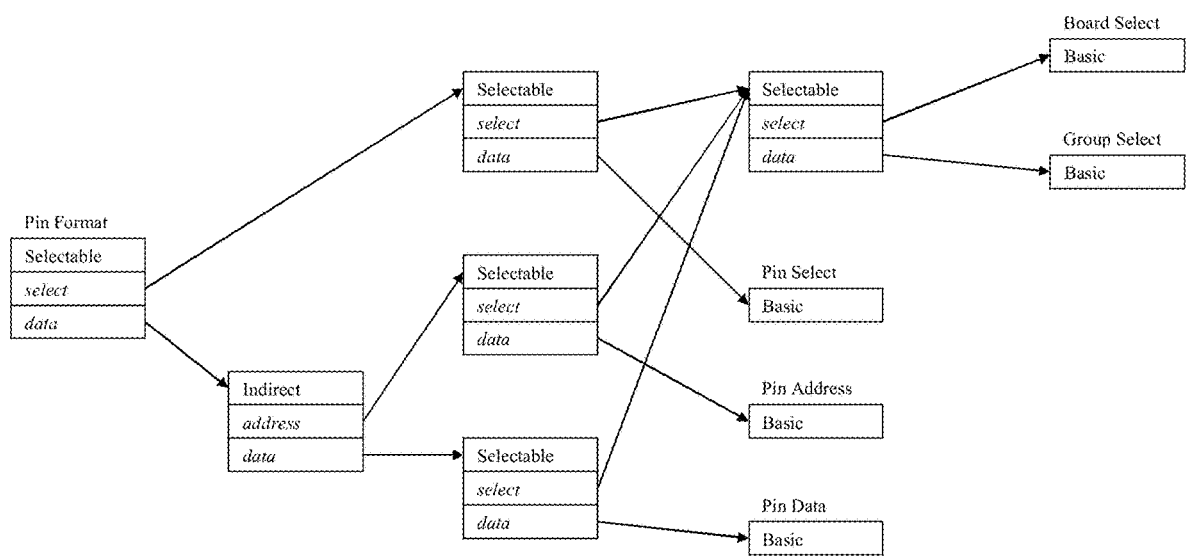

To illustrate this concept further, the register operations will be discussed for a General Logic Blade (GLB). It provides 80 instrument pins, divided into ten groups of eight. Each group of eight is controlled by a group controller. The board has an I/O controller which receives communication from the card bus. It has a group select register which selects the group controllers to talk to. Each group controller has a pin select register to control which of the eight pins to talk to. Let's now look at a single register for a GLB pin, as shown in the example of FIG. 6H. The group controllers maintain eight copies of many pin registers. Therefore the pin registers are indirect. There is one controlling the format for a pin. This is the register we will focus on. It is at an indirect address of 5 within the group controller. But before the system can write that, it needs to select the correct board, group, and pin. Since there are 80 pins on the GLB, the software maintains 80 format register objects per GLB. To set the first pin on the first GLB to NRZ format, we must write the value 4 to the first register. The software locates the correct register object and does a write operation with a value of 4. The format register is a selectable register. The procedure for writing to a selectable register is to first write a value to the select register and then write the data register. So the system must first write the value 1 to the pin select register. That register is also a selectable register. Before the system can write that, it needs to write the value 1 to the group select register. That register is also a selectable register. Before the system can write that, it is instructed to write a 1 to the board select register.

Once the system finish the writes, it can pop back to the second step of writing the format register, which is to write 4 to the data register. The data register is an indirect register. The procedure for writing to an indirect register is to first write a value to the address register and then write the data register. We need to write the value 5 to the pin address register and then write the value 4 to the pin data register. But wait, the pin address register is a selectable register. It will once again instruct us to first select group 1. Group one is already selected and since that register is nonvolatile we can skip that operation. This logic continues until all of the necessary addressing has been done and our value has been written.

The pin format register, illustrated in FIG. 6I, masquerades as a simple selectable register which points to two other register objects. In reality, it represents a tree structure which in turn directs the simple procedures for writing all of the necessary registers with the right values and in the correct order. This tree is set up at program initialization time. Not every register has an identical tree. There are other kinds of registers not mentioned here. But after initialization, I can take any register in the system and just say read or write and all of the appropriate actions take place to make it happen.

The parallelism is achieved through the register list operations. For reading, nothing changes since reading must be done one register at a time. But we just need to make some simple changes to the register list write routines to take advantage of all of the information already coded into the register objects. First we introduce a new register list operation called select. It takes only a register list, no data.

Default register list select procedure
   No operation
Register list select procedure for selectable registers
   Create an empty select register list
   Create an empty select value data list
   For each register in list
     Is this register's select register in the select register list?
       If no, append this register's select register to the list and append this register's select value to the data list
       If yes, OR this register's select value into the data for the register.
   Perform a register list write of the OR'ed select values to the select register list
   Perform a register list select operation on the select register list Now we need to supply the register list write routines for selectable registers. The default ones stay the same.

Register list write procedure for selectable registers (value list)
　For each value in list
　　Create a register list of registers writing that value
　　Perform register list write of one value
Register list write procedure for selectable registers (one value)
　If the registers are nonvolatile
　　For each register in list
　　　Check data against cache. If data matches, remove register from the list
　　Perform a register list select operation on this register list
　　Write the data to the first register in the list (writes to all registers)
　　Update all cache values The ATEworks with a DUT and one or more blades in a test-head. The DUT has a testing program, and includes a plurality of functional modules. The testing blades or module is connected to the device under test, and tests the plurality of functional modules of the device under test sequentially or in parallel. The DUT executes the testing program and communicates with the testing blade. The testing blade tests the plurality of functional modules of the DUT and testing is performed automatically without testers, and hence the personnel cost and the testing time can be reduced.

The system can test memory devices such as DRAMs and flash memory devices. The system can also test PC motherboards and other embedded electronic products. The system can be used to test analog electronic devices as well as wireless electronic devices to determine whether their functions are operating properly. For example, a test probe may be attached to a wireless device to determine whether its radio-frequency transceiver circuitry is able to properly generate radio-frequency output signals. Tests may also be performed that involve transmitting and receiving actual radio-frequency signals. For example, the system can act as a "call box" is used to send and receive protocol-compliant radio-frequency test data to a wireless device under test. Call box test equipment can handle bidirectional signaling-type test transmissions similar to full-fledged cellular telephone calls. If the call box determines that the device is not performing properly, the device may be repaired or discarded.

Figure 7A:
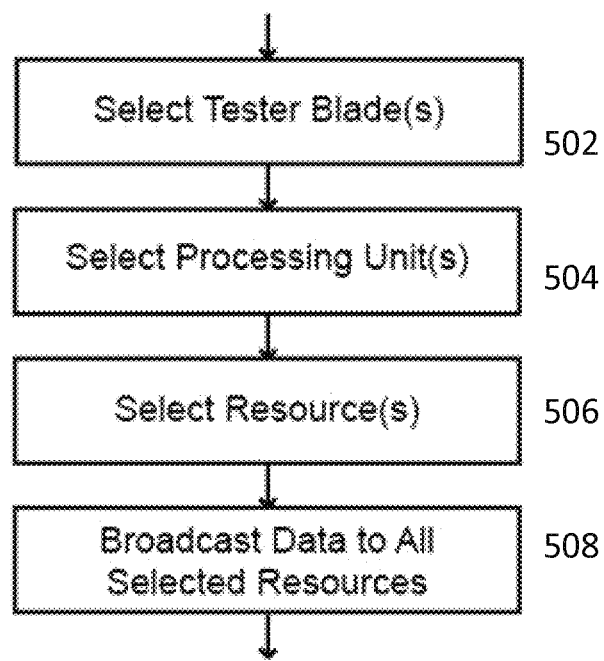
FIGS. 7A-7B show exemplary control processes for the tester.
Figure 7B:
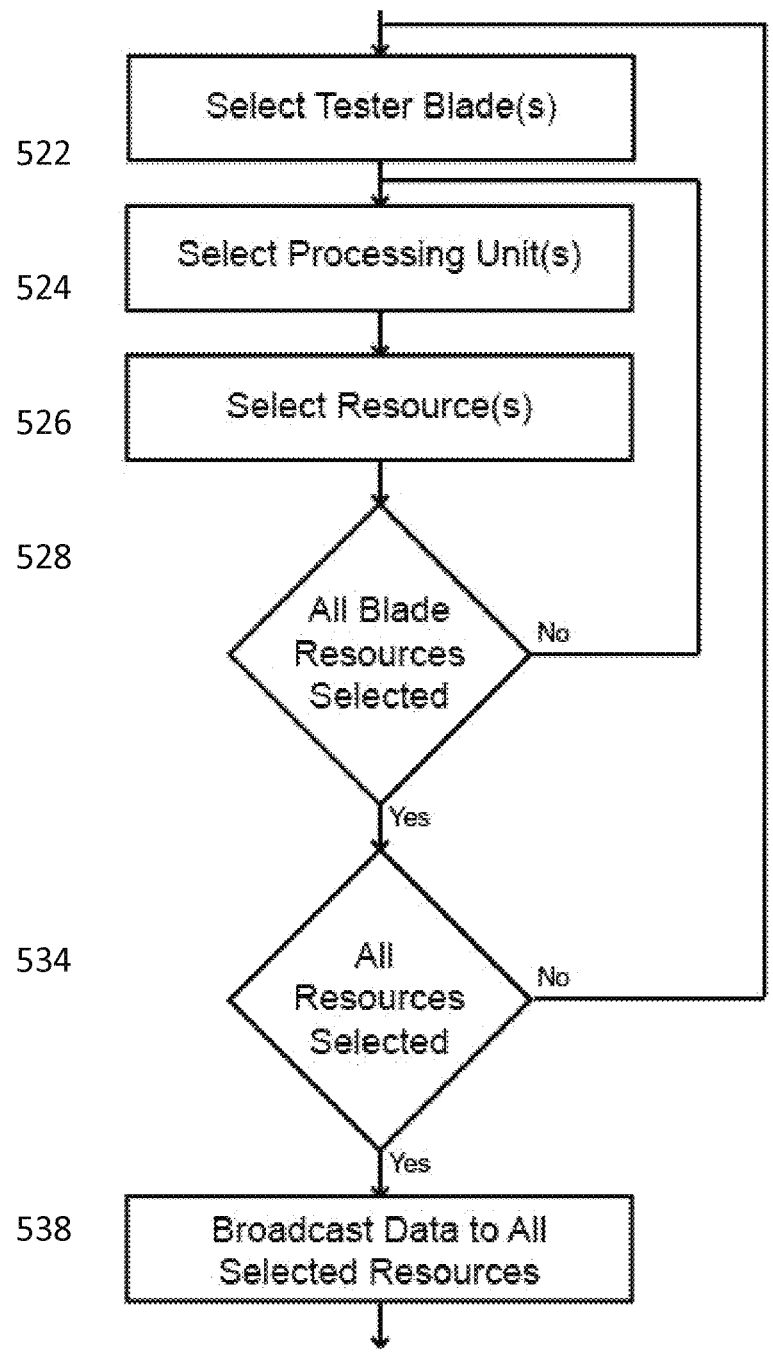

FIG. 7A-7B show exemplary control software for the tester. Turning now to FIG. 7A, the process selects one or more test blades in 502. It then selects processing units in 504 and resources in 506. The process then broadcasts data to all selected resources in 508.

Referring now to FIG. 7B, another control embodiment is shown. In this embodiment, the process selects tester blade(s) in 522 and processing units in 524. The process also selects resources in 526. The process then checks that all blade resources are selected in 528 and if not, it loops back to select processing units and resources, and otherwise the process proceeds to check if all resources have been selected in 534. If not, the process loops back to 522 and otherwise the process broadcasts data to all selected resources in 538.

Further embodiments of the present invention provide a method for testing a device under test. In a first step, an input signal is received from the device under test and information describing the input signal is written to a memory. In a second step, the information describing the input signal is read from the memory and an output signal is provided for the device under test based on the information describing the input signal read from the memory.

Further embodiments of the present invention provide an apparatus for configuring the ATE. The apparatus is adapted to configure the automatic test equipment to receive an input signal from a device under test and to write information describing the input signal to a memory. The apparatus is further adapted to configure the automatic test equipment to read the information describing the input signal from the memory 16 and to provide an output signal for the device under test based on the information describing the input signal read from the memory.

Further embodiments of the present invention provide a method for configuring the automatic test equipment. In a first step, the automatic test equipment is configured to receive an input signal from a device under test and to write information describing the input signal to a memory. In a second step, the automatic test equipment is configured to read the information describing the input signal from the memory and to provide an output signal for the device under test based on the information describing the input signal read from the memory. Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An automated test equipment (ATE) system, comprising:
   a plurality of test blades each coupled to a test blade connector and mounted on a circular track;
   a central reference clock (CRC) having an origin point at a center of the circular track; and
   a connector coupled to the CRC through a zero skew clock connection to one or more sync buses, wherein each blade instrument utilizes isolated digital ground and analog ground to prevent noisy ground current from affecting the test blades.
2. The system of claim 1, comprising a host computer coupled to the test blades.
3. The system of claim 1, comprising an adaptive semaphore signal transmission between a host computer and the test system.
4. The system of claim 1, comprising a Self Addressing Circular FIFO (SACF) to receive data from a host computer.
5. The system of claim 4, wherein the SACF is located on a Host Interface Board.
6. The system of claim 4, wherein the SACF stores several data transactions before slowing down data transfers.
7. The system of claim 4, wherein after emptying the FIFO, the host computer requests more data transfers and time for interactive transfers is dependent on blade requirements.
8. The system of claim 1, wherein the CRC starts each test sequence and provides a single frequency reference.
9. The system of claim 1, wherein one blade uses the CRC as a master clock or augments the CRC with one or more on-blade enhanced clocks that allow different blades to run at different frequencies.
10. The system of claim 1, wherein each blade runs in its own time-space.
11. The system of claim 1, wherein one or more test sequences are created and wherein different device under test (DUT) ports are tested with one or more unique timing references.
12. The system of claim 1, wherein each blade is electrically isolated from others, and wherein each blade communicates with another blade during testing by synchronization.
13. The system of claim 1, wherein the sync buses comprise multi-level sync buses that allow the blades to signal each other to coordinate their testing sequences.
14. The system of claim 1, comprising generating one or more sync events for combining error lines or to lock two blades together in time.
15. The system of claim 1, comprising a central power supply positioned at the center.
16. The system of claim 1, wherein each test blade is coupled to the central power supply, comprising one or more local power generators on each test blade to generate local power.
17. The system of claim 1, comprising an enclosure housing the test blade having one or more fans.
18. The system of claim 1, comprising both central and distributed clocks.
19. The system of claim 1, wherein each clock is buffered and distributed to test blades with matched transmission lines on a Master Clock board and a Backplane.
20. The system of claim 1, comprising a host computer that sends data faster than data distribution through serial protocols.

* * * * *